(12) United States Patent
Choi et al.

(10) Patent No.: US 11,996,358 B2
(45) Date of Patent: May 28, 2024

(54) SEMICONDUCTOR PACKAGES HAVING FIRST AND SECOND REDISTRIBUTION PATTERNS

(71) Applicant: Samsung Electronics Co., Ltd., Suwon-si (KR)

(72) Inventors: Ju-Il Choi, Seongnam-si (KR); Jumyong Park, Cheonan-si (KR); Jin Ho An, Seoul (KR); Dongjoon Oh, Suwon-si (KR); Chungsun Lee, Anyang-si (KR); Jeonggi Jin, Seoul (KR); Jinho Chun, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 401 days.

(21) Appl. No.: 17/364,558

(22) Filed: Jun. 30, 2021

(65) Prior Publication Data

US 2022/0037248 A1 Feb. 3, 2022

(30) Foreign Application Priority Data

Jul. 31, 2020 (KR) .................. 10-2020-0096147
Jan. 19, 2021 (KR) .................. 10-2021-0007625

(51) Int. Cl.
   *H01L 23/498* (2006.01)
(52) U.S. Cl.
   CPC .. *H01L 23/49838* (2013.01); *H01L 23/49822* (2013.01)
(58) Field of Classification Search
   CPC ............... H01L 23/49838; H01L 23/49822
   See application file for complete search history.

(56) References Cited

U.S. PATENT DOCUMENTS

| | | |
|---|---|---|
| 9,520,350 B2 | 12/2016 | Teh et al. |
| 10,074,602 B2 | 9/2018 | Lee |
| 10,424,539 B2 | 9/2019 | Lu et al. |
| 2016/0329299 A1* | 11/2016 | Lin ............... H01L 23/5389 |
| 2019/0341360 A1 | 11/2019 | Yu et al. |
| 2020/0105696 A1* | 4/2020 | Cheng ............ H01L 24/11 |

(Continued)

FOREIGN PATENT DOCUMENTS

| | | |
|---|---|---|
| JP | H11-016912 A | 1/1999 |
| JP | 6142499 B2 | 6/2017 |

(Continued)

*Primary Examiner* — Michael Jung
(74) *Attorney, Agent, or Firm* — Harness, Dickey & Pierce, P.L.C.

(57) ABSTRACT

A semiconductor package includes a redistribution substrate that includes a first redistribution pattern and a second redistribution pattern that are at different levels from each other, and a semiconductor chip on the redistribution substrate and including a plurality of chip pads electrically connected to the first and second redistribution patterns. The first redistribution pattern includes a first metal pattern on a first dielectric layer, and a first barrier pattern between the first dielectric layer and a bottom surface of the first metal pattern. The second redistribution pattern includes a second metal pattern in a second dielectric layer, and a second barrier pattern between the second dielectric layer and a bottom surface of the second metal pattern and between the second dielectric layer and a sidewall of the second metal pattern.

18 Claims, 28 Drawing Sheets

(56) References Cited

U.S. PATENT DOCUMENTS

| | | | |
|---|---|---|---|
| 2020/0126923 A1 | 4/2020 | Hu et al. | |
| 2020/0161242 A1 | 5/2020 | Lin et al. | |
| 2021/0343634 A1 | 11/2021 | Choi et al. | |
| 2021/0375672 A1* | 12/2021 | Cheng | H01L 21/76802 |
| 2021/0375674 A1* | 12/2021 | Cheng | H01L 21/76871 |
| 2021/0375675 A1* | 12/2021 | Cheng | H01L 24/05 |

FOREIGN PATENT DOCUMENTS

| | | |
|---|---|---|
| KR | 10-0393974 B1 | 8/2003 |
| KR | 10-2021-0133524 A | 11/2021 |

* cited by examiner

SEMICONDUCTOR PACKAGES HAVING FIRST AND SECOND REDISTRIBUTION PATTERNS

CROSS-REFERENCE TO RELATED APPLICATIONS

This U.S. nonprovisional application claims priority under 35 U.S.C. § 119 to Korean Patent Application No. 10-2020-0096147 filed on Jul. 31, 2020 in the Korean Intellectual Property Office and Korean Patent Application No. 10-2021-0007625 filed on Jan. 19, 2021 in the Korean Intellectual Property Office, the disclosures of each of which are hereby incorporated by reference in their entirety.

BACKGROUND

The present inventive concepts relate to semiconductor packages, and more particularly, to semiconductor packages including a redistribution substrate with high integration and increased reliability.

A semiconductor package is provided to implement an integrated circuit chip to qualify for use in electronic products. Typically, the semiconductor package is configured such that a semiconductor chip is mounted on a printed circuit board (PCB) and bonding wires or bumps are used to electrically connect the semiconductor chip to the printed circuit board. With the development of the electronic industry, various studies have been conducted to improve reliability and durability of semiconductor packages.

SUMMARY

Some example embodiments of the present inventive concepts provide a semiconductor package with high integration and increased reliability.

An object of the present inventive concepts is not limited to the mentioned above, and other objects which have not been mentioned above will be clearly understood to those skilled in the art from the following description.

According to some example embodiments of the present inventive concepts, a semiconductor package may include: a redistribution substrate that includes a first redistribution pattern and a second redistribution pattern that have respective bottom surfaces that are at different distances from a bottom surface of the redistribution substrate in a vertical direction that is perpendicular to the bottom surface of the redistribution substrate; and a semiconductor chip on the redistribution substrate, the semiconductor chip including a plurality of chip pads electrically connected to the first and second redistribution patterns. The first redistribution pattern may include: a first metal pattern on a first dielectric layer; and a first barrier pattern between the first dielectric layer and a bottom surface of the first metal pattern. The second redistribution pattern may include: a second metal pattern in a second dielectric layer; and a second barrier pattern that is between the second dielectric layer and a bottom surface of the second metal pattern and between the second dielectric layer and a sidewall of the second metal pattern.

According to some example embodiments of the present inventive concepts, a semiconductor package may include: a redistribution substrate that includes a plurality of first redistribution layers and a plurality of second redistribution layers that are vertically and alternately stacked in a vertical direction that is perpendicular to the bottom surface of the redistribution substrate; and a semiconductor chip on the redistribution substrate. Each of the first redistribution layers may include: a first dielectric layer; and a first redistribution pattern that includes a first via part and a first pad part connected to the first via part. The first via part may penetrate the first dielectric layer. The first pad part may be on a top surface of the first dielectric layer. Each of the second redistribution layers may include: a second dielectric layer on an underlying first dielectric layer of an underlying first redistribution layer; and a second redistribution pattern that includes a second via part and a second pad part connected to the second via part. The second via part may penetrate a portion of the second dielectric layer. The second pad part may be in the second dielectric layer.

According to some example embodiments of the present inventive concepts, a semiconductor package may include: a lower redistribution substrate that includes a first redistribution pattern on a first dielectric layer and a second redistribution pattern in a second dielectric layer on the first dielectric layer; a first semiconductor chip on the lower redistribution substrate, the first semiconductor chip including a plurality of chip pads; a plurality of first connection terminals between the lower redistribution substrate and the chip pads of the first semiconductor chip; a molding layer on the lower redistribution substrate, the molding layer covering the first semiconductor chip; and a plurality of metal pillars around the first semiconductor chip and connected to the lower redistribution substrate, the metal pillars penetrating the molding layer. The second dielectric layer may cover a sidewall of the first redistribution pattern. A top surface of the second dielectric layer may be coplanar with a top surface of the second redistribution pattern.

Details of other example embodiments are included in the description and drawings.

DETAILED DESCRIPTION

Figure 1:
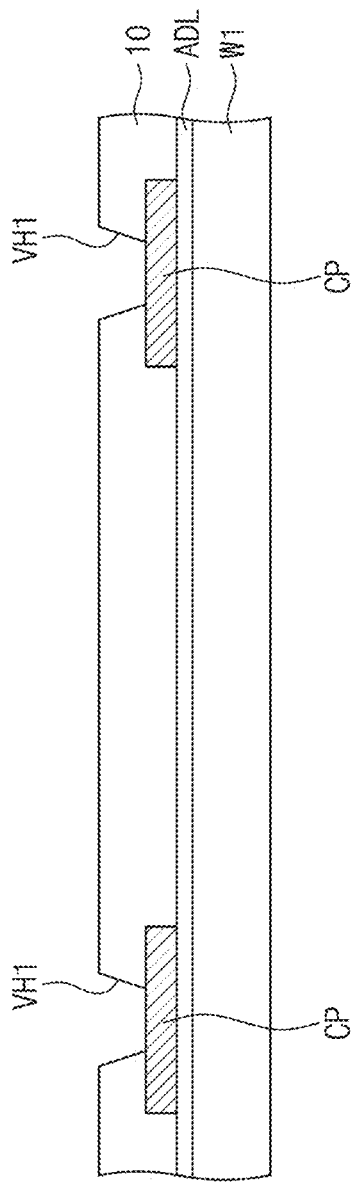
FIGS. 1, 2, 3, 4, 5, 6, 7, 8, 9, 10, 11, 12, 13, and 14 illustrate cross-sectional views showing a method of fabricating a redistribution substrate of a semiconductor package according to some example embodiments of the present inventive concepts.

The following will now describe a semiconductor package and a method of fabricating the same according to some example embodiments of the present inventive concepts in conjunction with the accompanying drawings.

As described herein, an element that is "on" another element may be above or beneath or adjacent (e.g., horizontally adjacent) to the other element. An element that is on another element may be directly on the other element, such that the element is in direct contact with the other element. An element that is on another element may be indirectly on the other element, such that the element is isolated from direct contact with the other element by one or more interposing spaces and/or structures.

It will be understood that elements and/or properties thereof (e.g., structures, surfaces, directions, or the like), which may be referred to as being "perpendicular," "parallel," "coplanar," or the like with regard to other elements and/or properties thereof (e.g., structures, surfaces, directions, or the like) may be "perpendicular," "parallel," "coplanar," or the like or may be "substantially perpendicular," "substantially parallel," "substantially coplanar," respectively, with regard to the other elements and/or properties thereof.

Elements and/or properties thereof (e.g., structures, surfaces, directions, or the like) that are "substantially perpendicular" with regard to other elements and/or properties thereof will be understood to be "perpendicular" with regard to the other elements and/or properties thereof within manufacturing tolerances and/or material tolerances and/or have a deviation in magnitude and/or angle from "perpendicular," or the like with regard to the other elements and/or properties thereof that is equal to or less than 10% (e.g., a. tolerance of ±10%).

Elements and/or properties thereof (e.g., structures, surfaces, directions, or the like) that are "substantially parallel" with regard to other elements and/or properties thereof will be understood to be "parallel" with regard to the other elements and/or properties thereof within manufacturing tolerances and/or material tolerances and/or have a deviation in magnitude and/or angle from "parallel," or the like with regard to the other elements and/or properties thereof that is equal to or less than 10% (e.g., a. tolerance of ±10%).

Elements and/or properties thereof (e.g., structures, surfaces, directions, or the like) that are "substantially coplanar" with regard to other elements and/or properties thereof will be understood to be "coplanar" with regard to the other elements and/or properties thereof within manufacturing tolerances and/or material tolerances and/or have a deviation in magnitude and/or angle from "coplanar," or the like with regard to the other elements and/or properties thereof that is equal to or less than 10% (e.g., a. tolerance of ±10%).

It will be understood that elements and/or properties thereof may be recited herein as being "the same" or "equal" as other elements, and it will be further understood that elements and/or properties thereof recited herein as being "identical" to, "the same" as, or "equal" to other elements may be "identical" to, "the same" as, or "equal" to or "substantially identical" to, "substantially the same" as or "substantially equal" to the other elements and/or properties thereof. Elements and/or properties thereof that are "substantially identical" to, "substantially the same" as or "substantially equal" to other elements and/or properties thereof will be understood to include elements and/or properties thereof that are identical to, the same as, or equal to the other elements and/or properties thereof within manufacturing tolerances and/or material tolerances. Elements and/or properties thereof that are identical or substantially identical to and/or the same or substantially the same as other elements and/or properties thereof may be structurally the same or substantially the same, functionally the same or substantially the same, and/or compositionally the same or substantially the same.

It will be understood that elements and/or properties thereof described herein as being the "substantially" the same and/or identical encompasses elements and/or properties thereof that have a relative difference in magnitude that is equal to or less than 10%. Further, regardless of whether elements and/or properties thereof are modified as "substantially," it will be understood that these elements and/or properties thereof should be construed as including a manufacturing or operational tolerance (e.g., ±10%) around the stated elements and/or properties thereof.

When the terms "about" or "substantially" are used in this specification in connection with a numerical value, it is intended that the associated numerical value include a tolerance of ±10% around the stated numerical value. When ranges are specified, the range includes all values therebetween such as increments of 0.1%.

FIGS. 1, 2, 3, 4, 5, 6, 7, 8, 9, 10, 11, 12, 13, and 14 illustrate cross-sectional views showing a method of fabricating a redistribution substrate of a semiconductor package according to some example embodiments of the present inventive concepts.

Referring to FIG. 1, an adhesive layer ADL may be formed on a carrier substrate W1. The carrier substrate W1 may be a glass substrate or a semiconductor substrate. The adhesive layer ADL may be, for example, a polymer tape including a dielectric material.

A first dielectric layer 10 may be formed on the adhesive layer ADL, covering conductive pads CP. The conductive pads CP may be formed by performing a deposition process, a patterning process, an electroplating process, or an electroless plating process. In some example embodiments, the conductive pads CP may be formed in a trench formed in a dielectric layer. The conductive pads CP may be formed of metal or its alloy each of which includes at least one selected from copper (Cu), aluminum (Al), nickel (Ni), silver (Ag), gold (Au), platinum (Pt), tin (Sn), lead (Pb), titanium (Ti), chromium (Cr), palladium (Pd), indium (In), zinc (Zn), and carbon (C).

A first dielectric layer 10 may be formed by a coating process, such as spin coating or slit coating. The first dielectric layer 10 may be formed of a photo-imageable dielectric (PID). The first dielectric layer 10 may include, for example, a photosensitive polymer. The photosensitive polymer may include, for example, one or more of photosensitive polyimide, polybenzoxazole, phenolic polymers, and benzocyclobutene polymers. In some example embodiments, the first dielectric layer 10 may be formed of a silicon oxide layer, a silicon nitride layer, or a silicon oxynitride layer.

Afterwards, first via holes VH1 may be formed in the first dielectric layer 10, exposing the conductive pads CP.

When the first dielectric layer 10 includes a photosensitive polymer, the first via holes VH1 may be formed by performing exposure and development processes on portions of the first dielectric layer 10. After the formation of the first via holes VH1, a cure process may be performed on the first dielectric layer 10.

Figure 2:
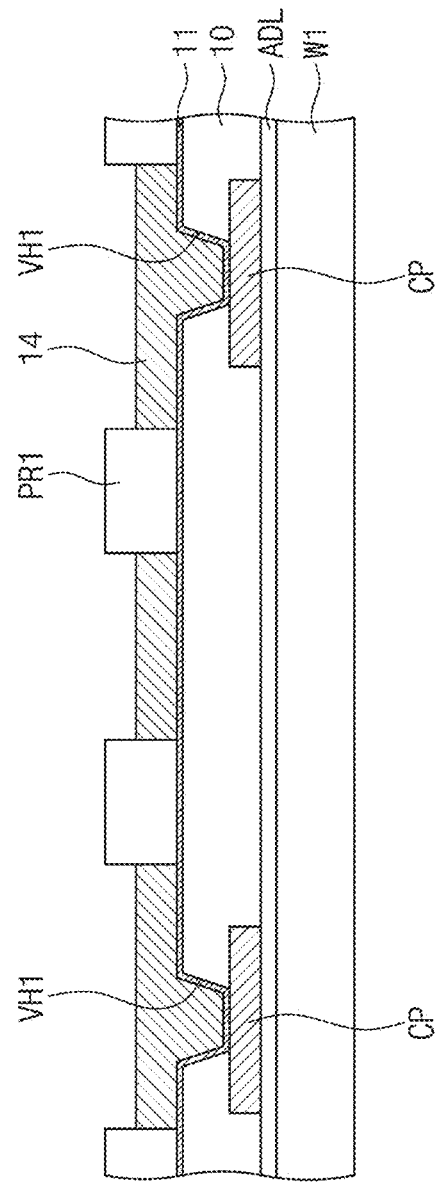

Referring to FIG. 2, a first barrier layer 11 may be formed on the first dielectric layer 10 in which the first via holes VH1 are formed.

The first barrier layer 11 may be deposited to have the same thickness on the first dielectric layer 10 in which the first via holes VH1 are formed. For example, the first barrier layer 11 may conformally cover inner walls of the first via holes VH1 and a top surface of the first dielectric layer 10. The first barrier layer 11 may be in contact with portions of the conductive pads CP exposed to the first via holes VH1. The first barrier layer 11 may be formed by using physical vapor deposition (PVD), chemical vapor deposition (CVD), or atomic layer deposition (ALD).

The formation of the first barrier layer 11 may include sequentially depositing a barrier metal layer and a metal seed layer. The barrier metal layer may include, for example, a double layer or a mixture layer other than the double layer, which double or mixture layer may include titanium, titanium nitride, tantalum, tantalum nitride, ruthenium, cobalt, manganese, tungsten nitride, nickel, nickel boride, or titanium/titanium nitride. The metal seed layer may include, for example, copper (Cu).

After the formation of the first barrier layer 11, a first photoresist pattern PR1 having openings may be formed on the first barrier layer 11. The first photoresist pattern PR1 may be formed by forming a photoresist layer on the first barrier layer 11 and then performing exposure and development processes.

Some openings of the first photoresist pattern PR1 may overlap the first via holes VH1. The first photoresist pattern PR1 may include a line-and-space pattern. The first photoresist pattern PR1 may have a line-width of about 5.0 μm to about 10.0 μM.

After that, first metal patterns 14 may be formed in the openings and the first via holes VH1 in which the first barrier layer 11 is formed.

The first metal patterns 14 may completely fill the openings and the first via holes VH1 in which the first barrier layer 11 is formed. The first metal patterns 14 may be formed on a top surface of the first barrier layer 11 exposed to the openings of the first photoresist pattern PR1. The first metal patterns 14 may be formed by performing an electroplating process, such as plating or pulse plating. The first metal pattern 14 may be grown from a surface of the metal seed layer. The first metal pattern 14 may include a metal, such as copper (Cu), the same as that of the metal seed layer.

Figure 3:
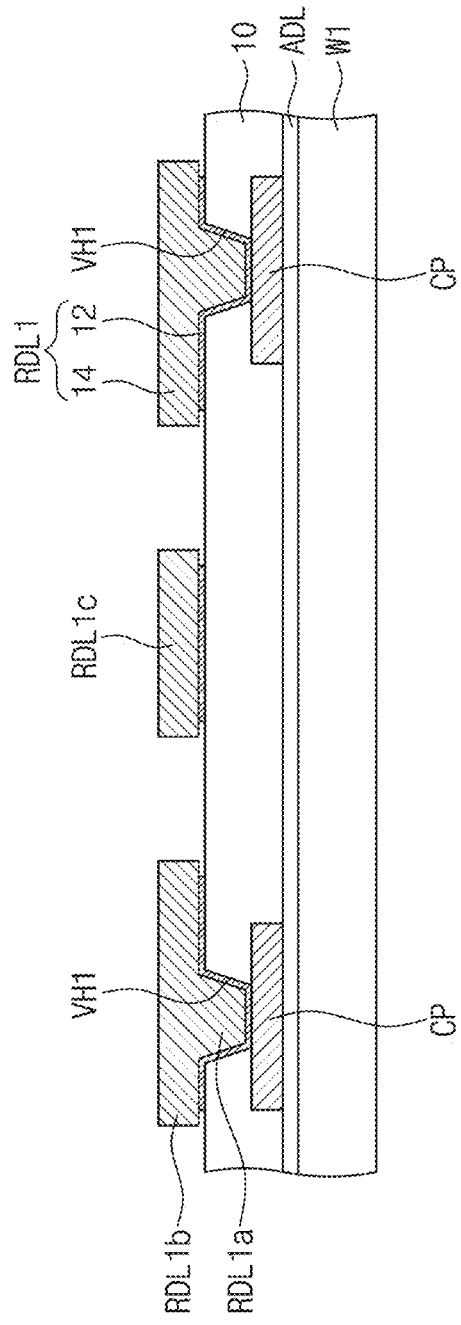

Referring to FIG. 3, the first photoresist pattern PR1 may be removed, and then the first barrier layer 11 below the first photoresist pattern PR1 may be etched to expose the top surface of the first dielectric layer 10. The first photoresist pattern PR1 may be removed by performing an ashing process or a strip process, and the first barrier layer 11 may be etched by performing a wet etching process. Therefore, first redistribution patterns RDL1 may be formed, and each of the first redistribution patterns RDL1 may include a first barrier pattern 12 and a first metal pattern 14. The first metal pattern 14 may have a sidewall defined by that of the first photoresist pattern PR1, and may be a linear sidewall perpendicular to the top surface of the first dielectric layer 10. During the wet etching process performed on the first barrier layer 11, a sidewall of the first barrier pattern 12 may be recessed more than that of the first metal pattern 14.

The first redistribution patterns RDL1 may include first via parts RDL1a that penetrate the first dielectric layer 10, first pad parts RDL1b on the first dielectric layer 10 and connected to the first via parts RDL1a, and first line parts RDL1c that extend in one direction from the first pad parts RDL1b and are disposed on the first dielectric layer 10.

Figure 4:
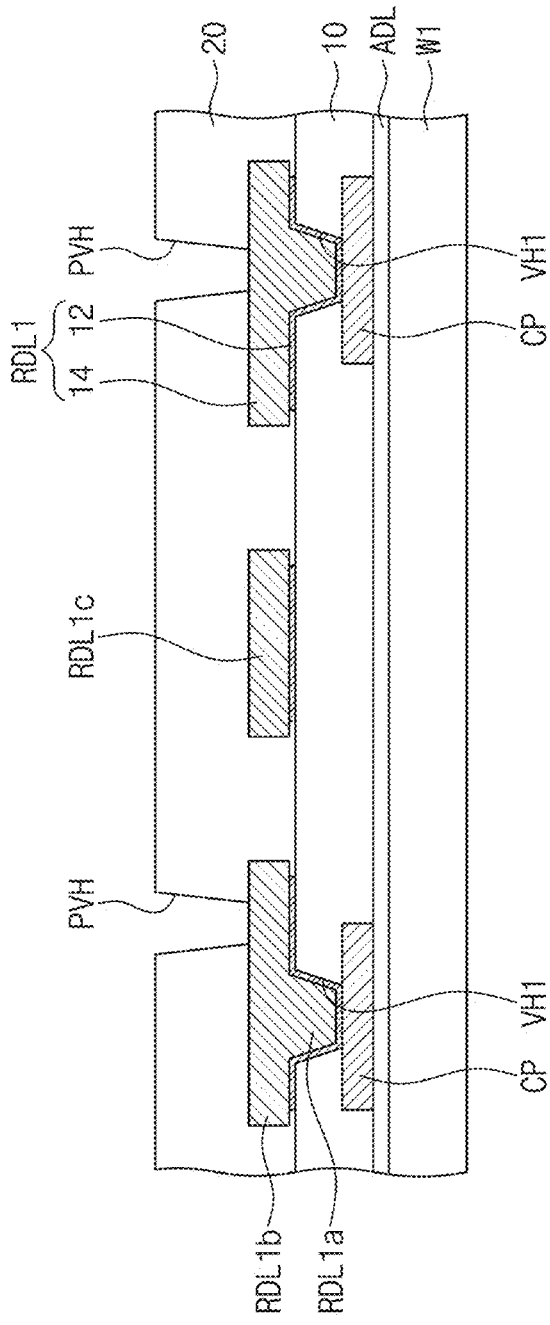

Referring to FIG. 4, a second dielectric layer 20 may be formed on the first dielectric layer 10, covering the first redistribution patterns RDL1. The second dielectric layer 20 may be thicker than the first dielectric layer 10.

The second dielectric layer 20 may be formed by a coating process, such as spin coating or slit coating. The second dielectric layer 20 may be formed of a photo-imageable dielectric. The second dielectric layer 20 may include, for example, a photosensitive polymer. The photosensitive polymer may include, for example, one or more of photosensitive polyimide, polybenzoxazole, phenolic polymers, and benzocyclobutene polymers. The second dielectric layer 20 may include a polymeric material the same as or different from that of the first dielectric layer 10. In some example embodiments, the second dielectric layer 20 may be formed of a silicon oxide layer, a silicon nitride layer, or a silicon oxynitride layer.

After that, preliminary via holes PVH may be formed in the second dielectric layer 20. The preliminary via holes PVH may expose portions of the first redistribution patterns RDL1. The preliminary via holes PVH may be formed by performing exposure and development processes on the second dielectric layer 20. Afterwards, a cure process may be performed on the second dielectric layer 20.

Figure 5:
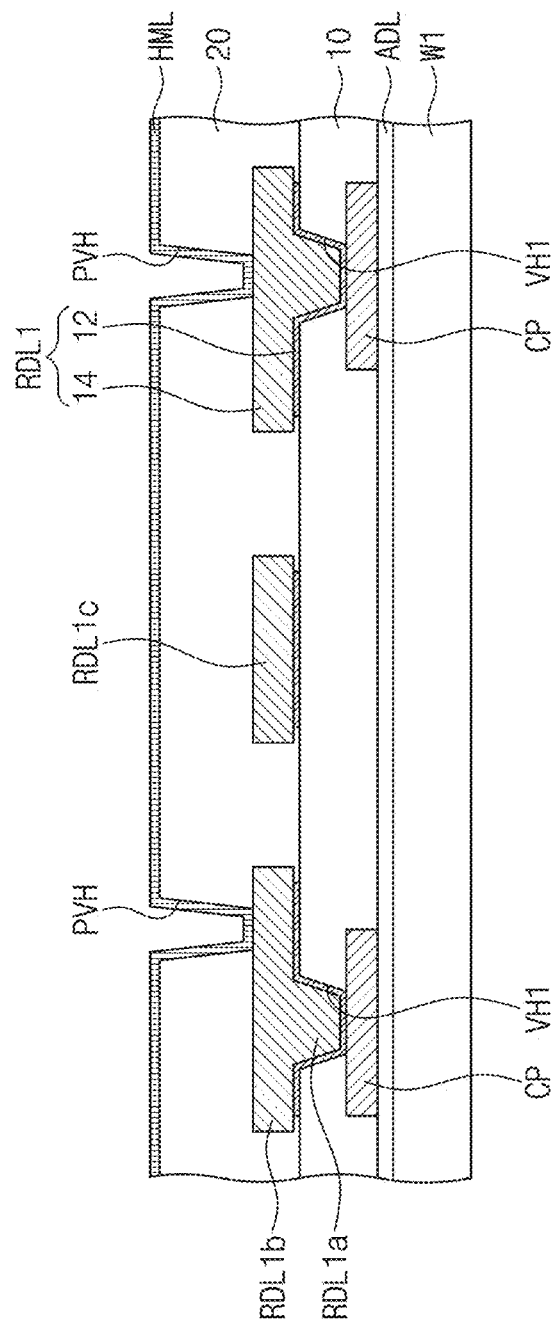

Referring to FIG. 5, a hardmask layer HML may be formed on the second dielectric layer 20 in which the preliminary via holes PVH are formed. The hardmask layer HML may conformally cover inner walls of the preliminary via holes PVH and a top surface of the second dielectric layer 20. The hardmask layer HML may cover top surfaces of the first redistribution patterns RDL1 exposed to the preliminary holes PVH.

The hardmask layer HML may be formed of a material having an etch selectivity with respect to the second dielectric layer 20. The hardmask layer HML may include a metallic material, such as titanium, titanium nitride, tantalum, tantalum nitride, or tungsten. In some example embodiments, the hardmask layer HML may be a polysilicon layer, a silicon nitride layer, or a silicon oxynitride layer. The hardmask layer HML may be formed by using PVD, CVD, or ALD.

Figure 6:
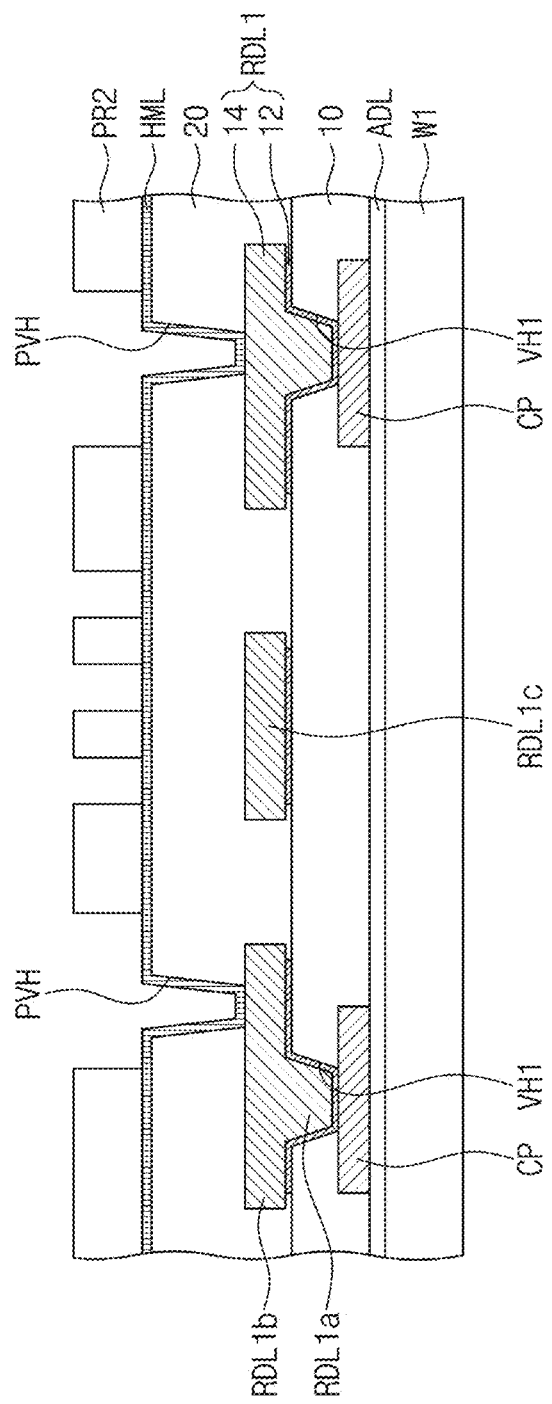

Referring to FIG. 6, a second photoresist pattern PR2 may be formed on the hardmask layer HML. The second photoresist pattern PR2 may be formed by forming a photoresist layer on the hardmask layer HML and then performing exposure and development processes.

The second photoresist pattern PR2 may include openings that expose portions of the hardmask layer HML. Some openings of the second photoresist pattern PR2 may overlap the preliminary via holes PVH. The second photoresist pattern PR2 may include a line-and-space pattern. The second photoresist pattern PR2 may have a line-width of about 0.5 μm to about 2.5 μm.

Figure 7:
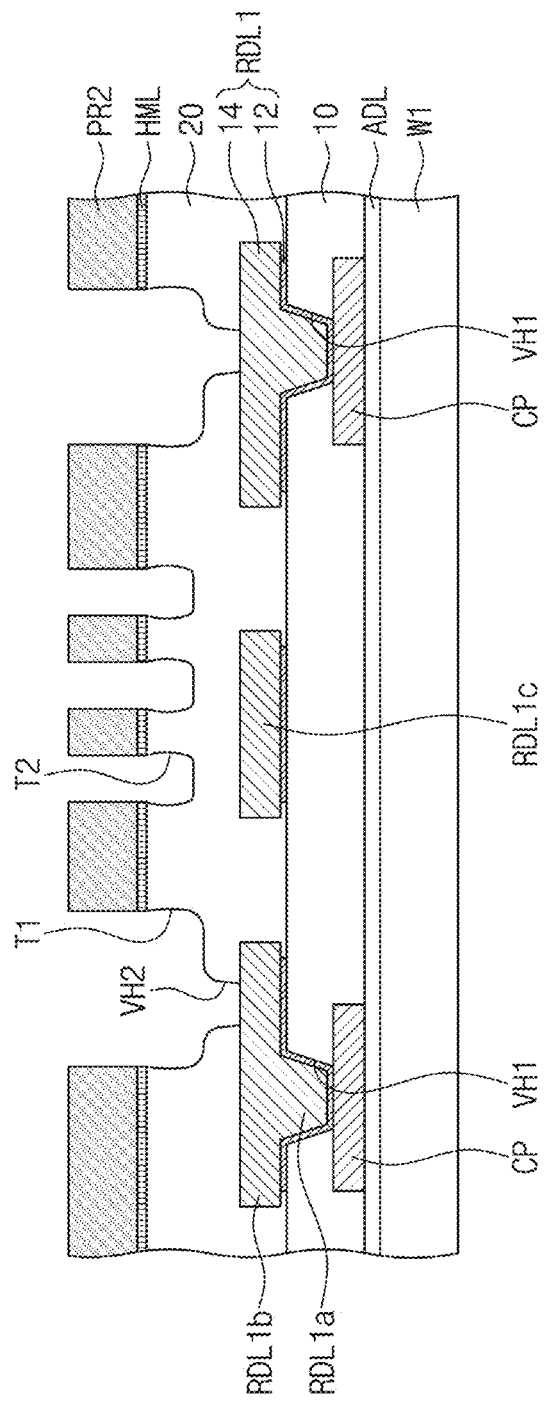

Referring to FIG. 7, the second photoresist pattern PR2 may be used as an etching mask to perform an anisotropic etching process on the hardmask layer HML. Therefore, a hardmask pattern HMP may be formed on the second dielectric layer 20. The anisotropic etching process performed on the hardmask layer HML may include reactive ion etching (RIE), magnetically enhanced reactive ion etching (MERIE), inductively coupled plasma (ICP) etching, transformer coupled plasma (TCP) etching, hollow anode type plasma etching, or helical resonator plasma etching.

A $C_xF_y$ etching gas may be used in the anisotropic etching process performed on the hardmask layer HML. For example, the etching gas may include $CF_4$, $C_3F_6$, $C_4F_6$, $C_4F_8$, $C_5F_8$, $CH_3F$, $CHF_3$, $CH_2F_2$, or any combination thereof. In addition, an inert gas, such as argon (Ar), may be used in the anisotropic etching process performed on the hardmask layer HML.

The second dielectric layer 20 may be partially overetched in the anisotropic etching process performed on the hardmask layer HML. Therefore, preliminary trenches (not shown) may be formed on the second dielectric layer 20.

Afterwards, the hardmask pattern HMP may be used as an etching mask to perform an anisotropic etching process on the second dielectric layer 20. The anisotropic etching process performed on the second dielectric layer 20 may include reactive ion etching (RIE), magnetically enhanced reactive ion etching (MERIE), inductively coupled plasma (ICP) etching, transformer coupled plasma (TCP) etching, hollow anode type plasma etching, or helical resonator plasma etching.

Thus, first and second trenches T1 and T2 may be formed on the second dielectric layer 20, and second via holes VH2 may be formed to expose the first pad parts RDL1b of the first redistribution patterns RDL1. The second via holes VH2 may be connected to the first trenches T1, and the first trenches T1 may have their widths greater than those of the second trenches T2.

When forming the first and second trenches T1 and T2 having different widths from each other, loading effects may cause the second trenches T2 to have their depths different from those of the first trenches T1. In some example embodiments, the first trenches T1 may have their depths greater than those of the second trenches T2.

Further, because the first trenches T1 are formed after the preliminary via holes PVH are formed, the preliminary via hole PVH and the first trench T1 may have therebetween a corner section (for example, a location at which a width is changed) that becomes rounded while the anisotropic etching process is performed on the second dielectric layer 20. In addition, the second trenches T2 may become rounded at their lower corners.

Moreover, when the etching process is performed to form the first and second trenches T1 and T2, a bowing phenomenon may allow the first and second trenches T1 and T2 to have their rounded sidewalls. For example, the first and second trenches T1 and T2 may have their laterally convex sidewalls.

Figure 8:
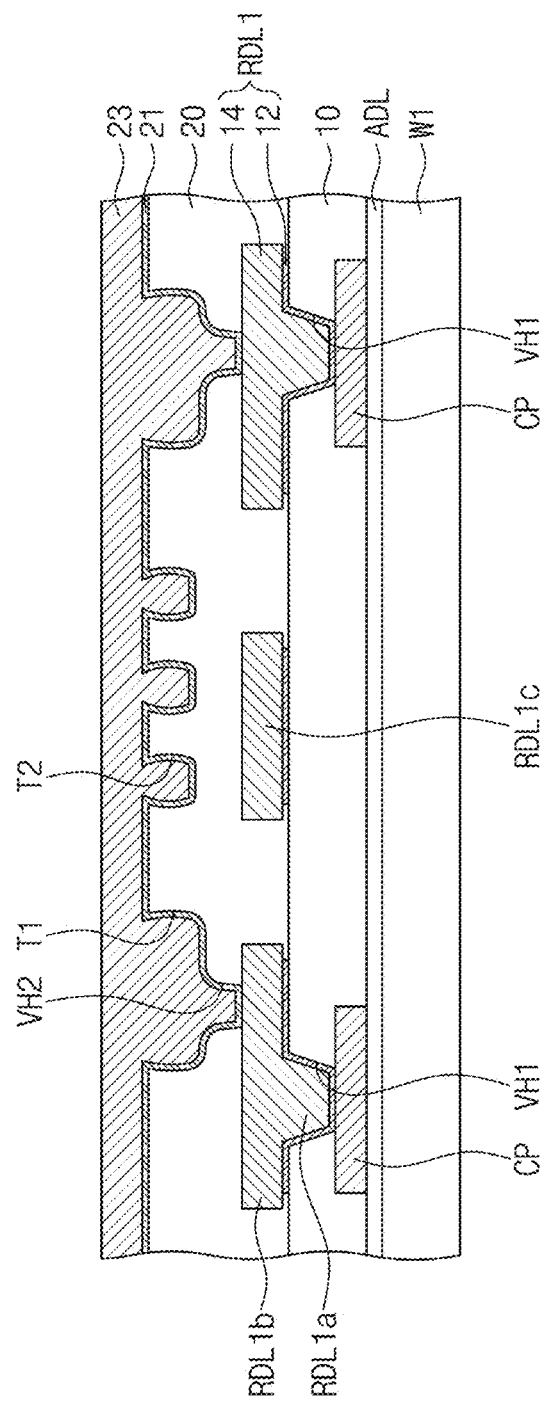

Referring to FIG. 8, after the formation of the second via holes VH2 and the first and second trenches T1 and T2, the second photoresist pattern PR2 and the hardmask pattern HMP may be removed. The second photoresist pattern PR2 may be removed by a strip process that includes ashing and cleaning steps. A wet etching process may be employed to remove the hardmask pattern HMP.

Thereafter, a second barrier layer 21 and a second metal layer 23 may be sequentially formed on the second dielectric layer 20 on which are formed the second via holes VH2 and the first and second trenches T1 and T2.

The second barrier layer 21 may be deposited to have the same thickness on the second dielectric layer 20 on which are formed the second via holes VH2 and the first and second trenches T1 and T2. For example, the second barrier layer 21 may conformally cover inner walls of the second via holes VH2, inner walls of the first and second trenches T1 and T2, and the top surface of the second dielectric layer 20. The second barrier layer 21 may be formed by using PVD, CVD, or ALD.

The formation of the second barrier layer 21 may include sequentially depositing a barrier metal layer and a metal seed layer. The barrier metal layer may include, for example, a double layer or a mixture layer other than the double layer, which double or mixture layer may include titanium, titanium nitride, tantalum, tantalum nitride, ruthenium, cobalt, manganese, tungsten nitride, nickel, nickel boride, or titanium/titanium nitride. The metal seed layer may include, for example, copper (Cu).

The second metal layer 23 may completely fill the second via holes VH2 and the first and second trenches T1 and T2 in which the second barrier layer 21 is formed. The second metal layer 23 may also be formed on the top surface of the second dielectric layer 20. The second metal layers 23 may be formed by performing an electroplating process, such as plating or pulse plating. The second metal layer 23 may be grown from a surface of the metal seed layer.

Figure 9:
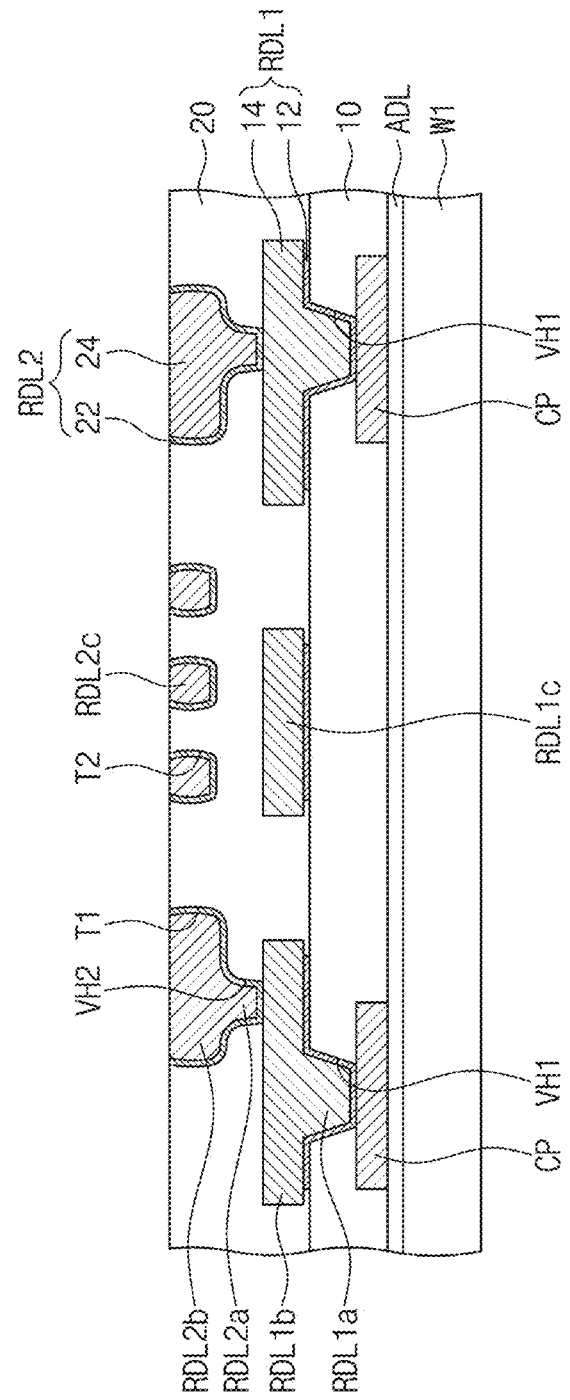

Referring to FIG. 9, the second metal layer 23 and the second barrier layer 21 may undergo a planarization process to expose the top surface of the second dielectric layer 20. A chemical mechanical polishing (CMP) process may be performed as the planarization process. The planarization process may form second redistribution patterns RDL2 separated from each other. Each of the second redistribution patterns RDL2 may include a second barrier pattern 22 and a second metal pattern 24.

The planarization process may allow the second redistribution patterns RDL2 to have their substantially even top surfaces. In addition, the top surfaces of the second redistribution patterns RDL2 may be coplanar with the top surface of the second dielectric layer 20.

The second redistribution patterns RDL2 may include second via parts RDL2a that penetrate a portion of the second dielectric layer 20 and second pad parts RDL2b in the second dielectric layer 20 and connected to the second via parts RDL2a. In addition, the second redistribution patterns RDL2 may include second line parts RDL2c that extend in one direction in the second dielectric layer 20 and are separated from each other.

Figure 10:
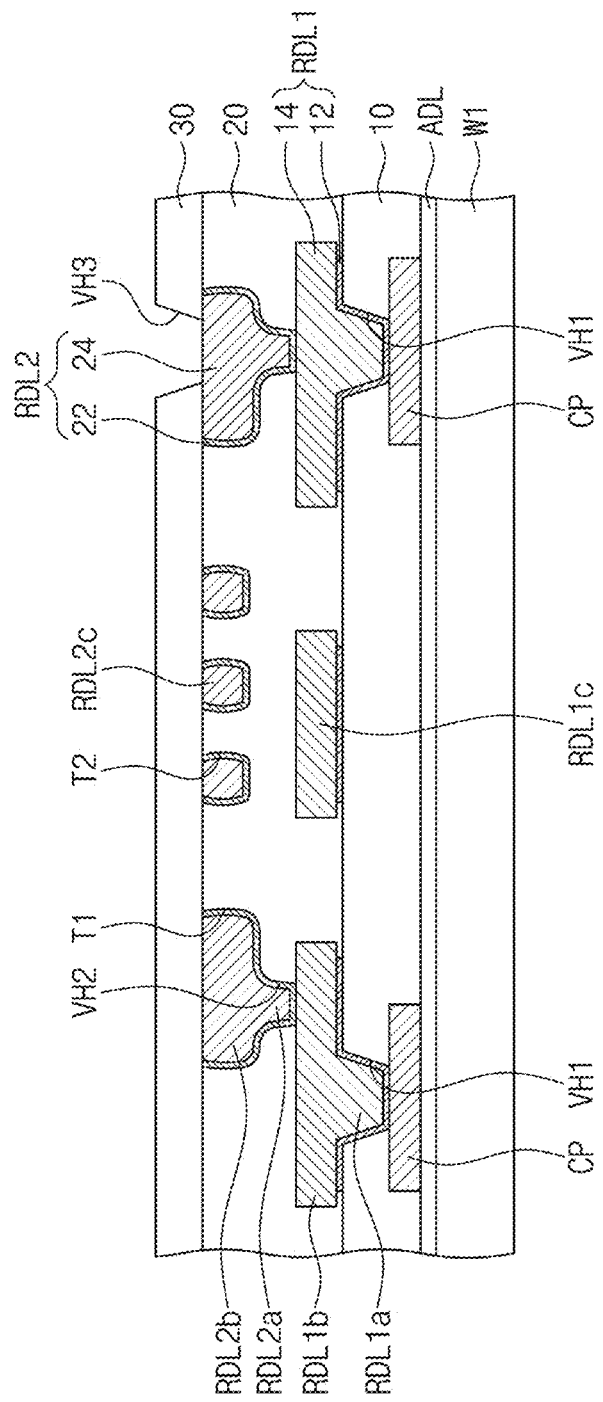

Referring to FIG. 10, a third dielectric layer 30 may be formed on the second dielectric layer 20, covering top surfaces of the second redistribution patterns RDL2.

The third dielectric layer 30 may be formed of a photoimageable dielectric (PID). The third dielectric layer 30 may include, for example, a photosensitive polymer. The photosensitive polymer may include, for example, one or more of photosensitive polyimide, polybenzoxazole, phenolic polymers, and benzocyclobutene polymers. For example, the third dielectric layer 30 may be formed of the same polymeric material as that of the second dielectric layer 20. For another example, the third dielectric layer 30 may include a polymeric material the same as that of the first dielectric layer 10 and different from that of the second dielectric layer 20. For another example, the third dielectric layer 30 may be formed of a silicon oxide layer, a silicon nitride layer, or a silicon oxynitride layer.

Afterwards, third via holes VH3 may be formed in the third dielectric layer 30, exposing portions of the second redistribution patterns RDL2. When the third dielectric layer 30 includes a photosensitive polymer, the third via holes VH3 may be formed by performing exposure and development processes on portions of the third dielectric layer 30.

After the formation of the third via holes VH3, a cure process may be performed on the third dielectric layer 30.

Figure 11:
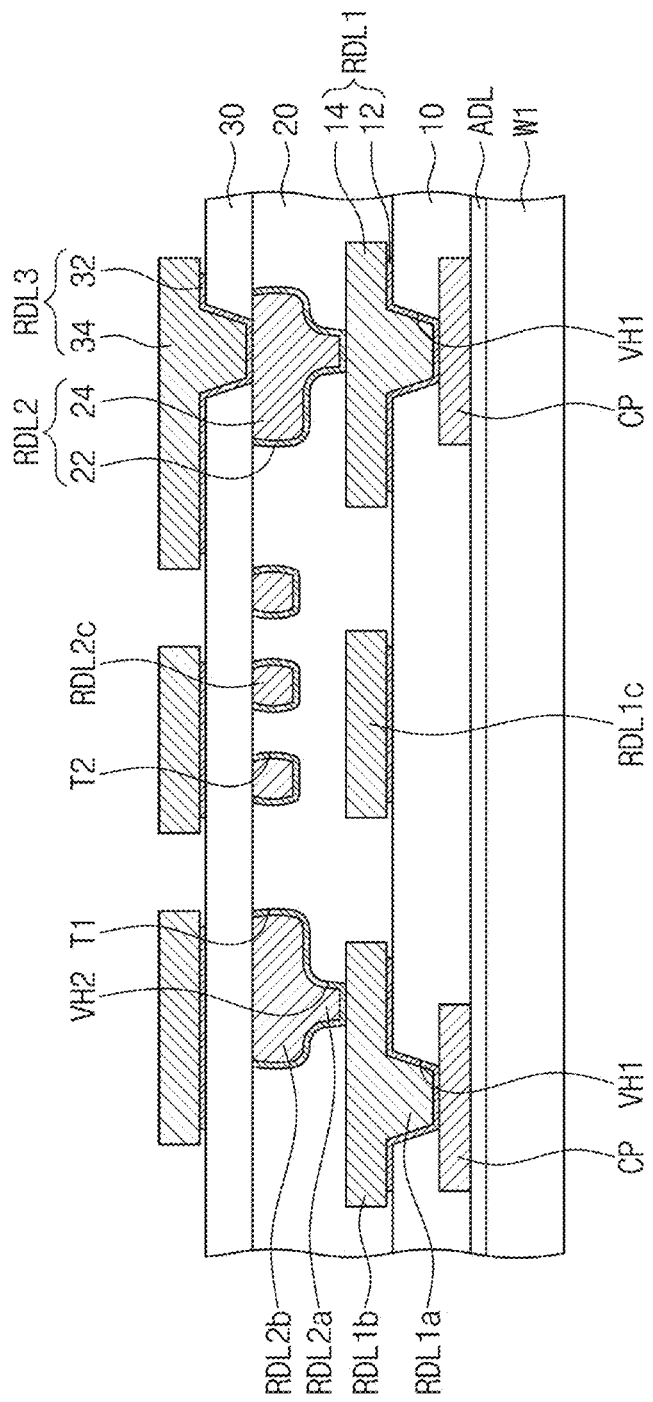

Referring to FIG. 11, similarly to the formation of the first redistribution patterns RDL1 discussed above with reference to FIGS. 2 and 3, third redistribution patterns RDL3 may be formed on the third dielectric layer 30.

For example, the formation of the third redistribution patterns RDL3 may include forming a third barrier layer that covers surfaces of the third via holes VH3 and the third dielectric layer 30, forming a photoresist pattern on the third barrier layer, forming a third metal layer that fills an opening of the photoresist pattern, removing the photoresist pattern, and then etching the third barrier layer. Therefore, each of the third redistribution patterns RDL3 may include a third barrier pattern 32 and a third metal pattern 34. The third redistribution patterns RDL3 may have properties the same as those of the first redistribution patterns RDL1 discussed above.

Figure 12:
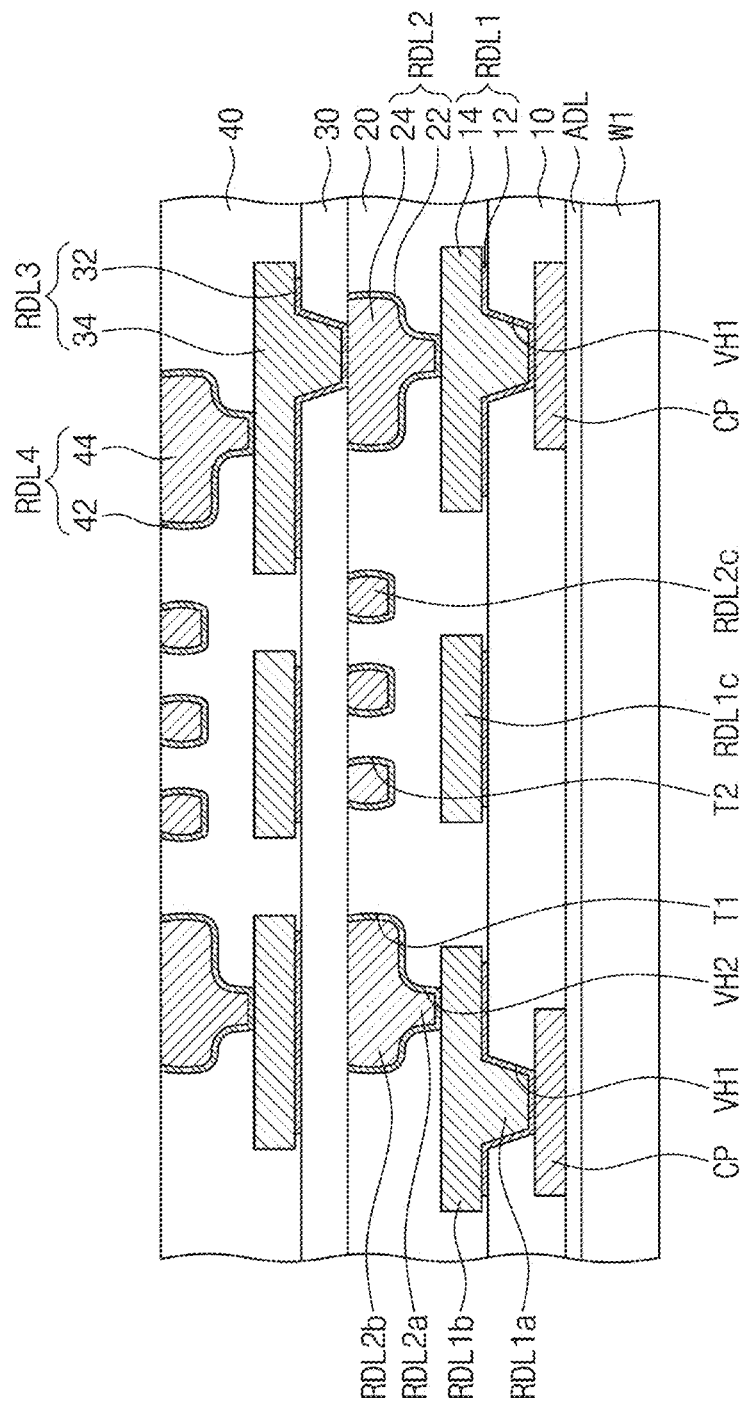

Referring to FIG. 12, a fourth dielectric layer 40 may be formed on the third dielectric layer 30, covering the third redistribution patterns RDL3. The fourth dielectric layer 40 may be thicker than the third dielectric layer 30 and may cover sidewalls of pad and line parts included in the third redistribution patterns RDL3.

The fourth dielectric layer 40 may include a photo-imageable dielectric (PID), such as a photosensitive polymer. For example, the fourth dielectric layer 40 may include the same polymer as that of the second dielectric layer 20.

After that, similarly to the formation of the second redistribution patterns RDL2 discussed above with reference to FIGS. 4 to 9, fourth redistribution patterns RDL4 may be formed in the fourth dielectric layer 40. For example, after a hardmask pattern HMP is formed on the fourth dielectric layer 40, the fourth dielectric layer 40 may be patterned to form via holes and trenches and then a fourth barrier layer and a fourth metal layer may be formed in the via holes and the trenches. Therefore, each of the fourth redistribution patterns RDL4 may include a fourth barrier pattern 42 and a fourth metal pattern 44. The fourth redistribution patterns RDL4 may have properties the same as those of the second redistribution patterns RDL2 discussed above.

Figure 13:
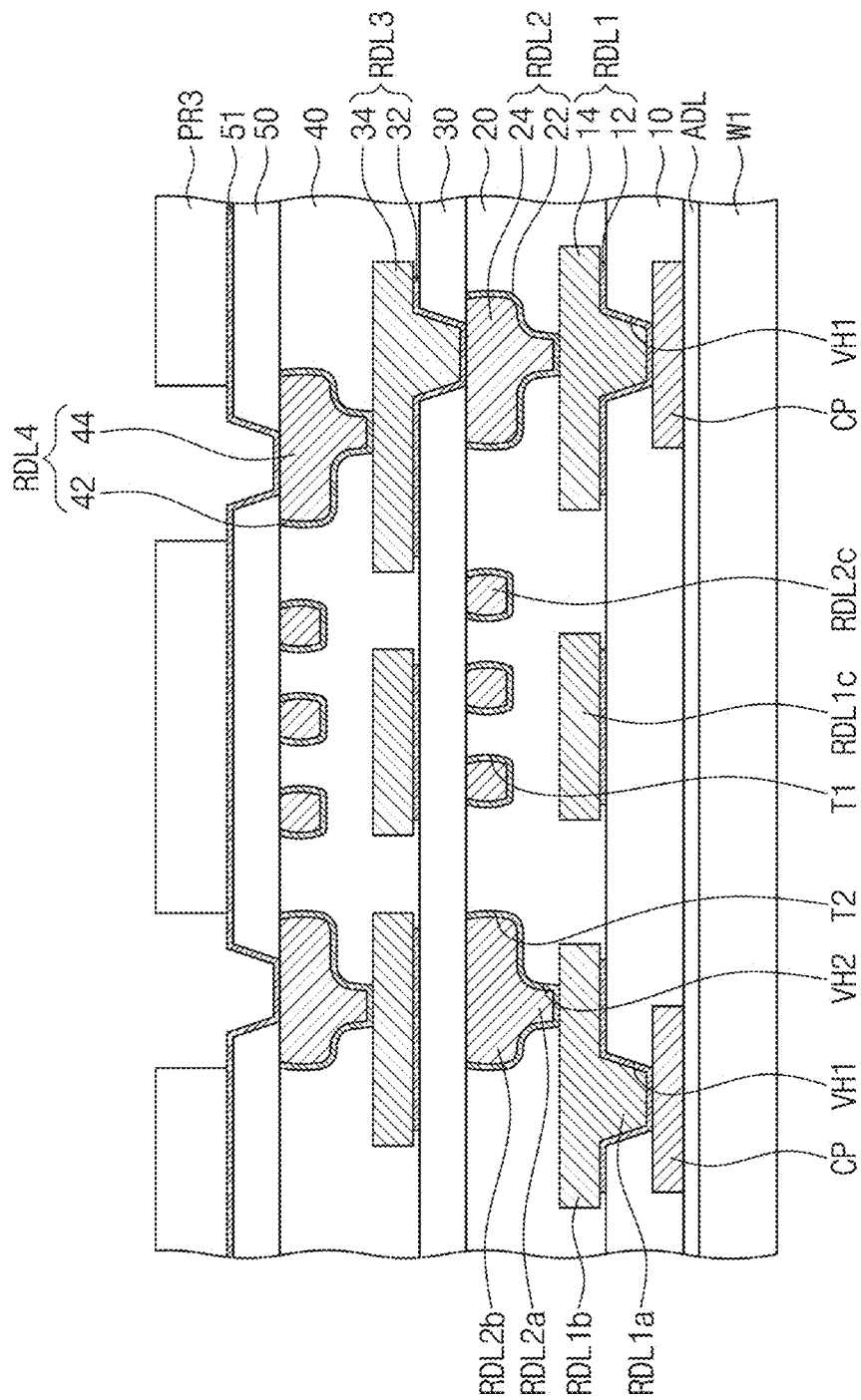

Referring to FIG. 13, a fifth dielectric layer 50 may be formed on the fourth dielectric layer 40, covering the fourth redistribution patterns RDL4. The fifth dielectric layer 50 may include a photo-imageable dielectric, such as a photosensitive polymer. The fifth dielectric layer 50 may include the same polymer as that of the third dielectric layer 30.

Portions of the fifth dielectric layer 50 may undergo exposure and development processes to form fifth via holes that expose portions of the fourth redistribution patterns RDL4.

After that, a fifth barrier layer 51 may be formed to conformally cover a surface of the fifth dielectric layer 50 in which the fifth via holes are formed. A third photoresist pattern PR3 having openings may be formed on the fifth barrier layer 51. The openings of the third photoresist pattern PR3 may overlap the fifth via holes.

Figure 14:
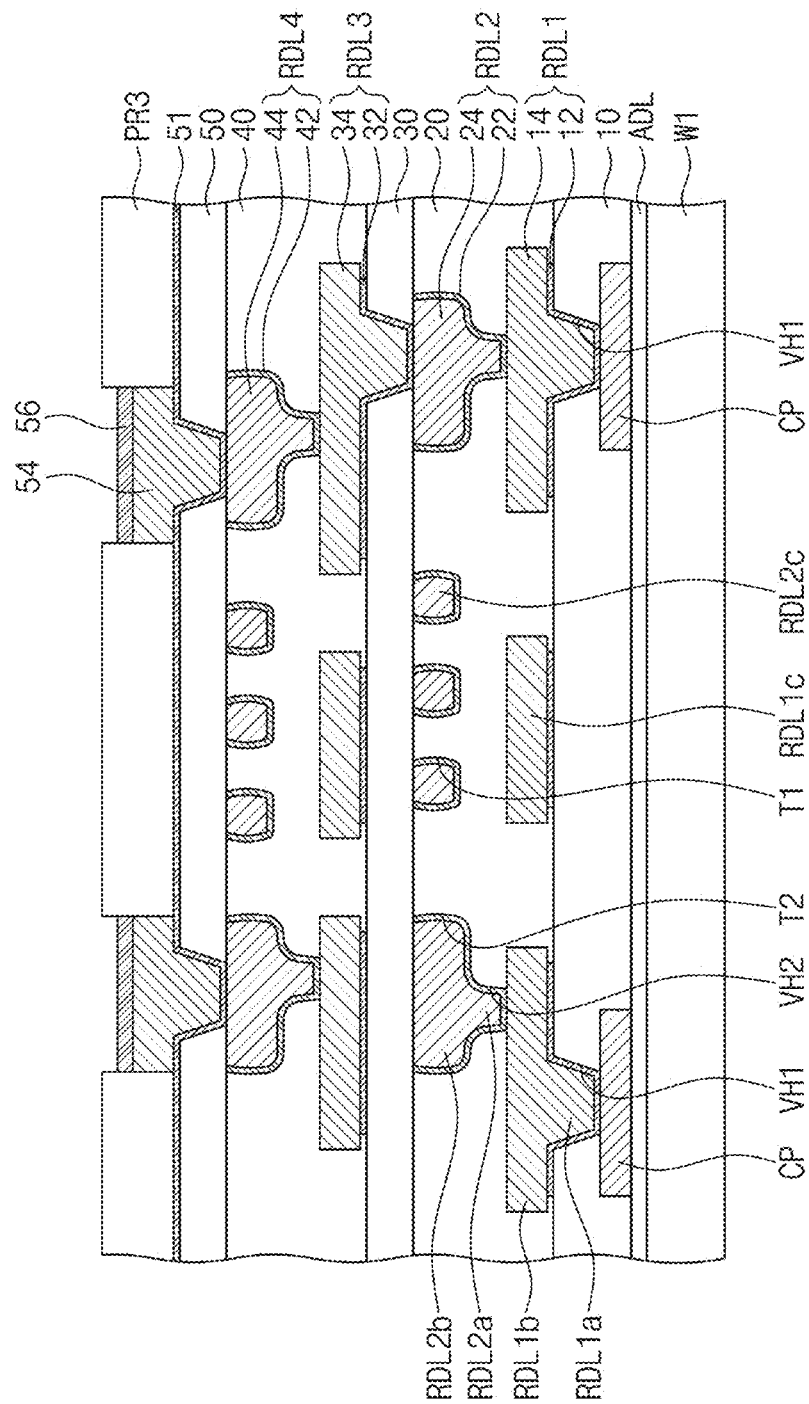

Referring to FIG. 14, as discussed above with reference to FIG. 2, an electroplating process, such as plating or pulse plating, may be performed to form fifth metal patterns 54 that fills the openings of the third photoresist pattern PR3.

After that, metal pads 56 may be formed on the fifth metal patterns 54. For example, the metal pads 56 may be formed of metal or its alloy each of which includes at least one selected from copper (Cu), nickel (Ni), and gold (Au), and may have a multi-layered structure including a plurality of metals selected from copper (Cu), nickel (Ni), and gold (Au).

After the formation of the metal pads 56, the third photoresist pattern PR3 may be removed by a strip process that includes ashing and cleaning steps. Then, a wet etching process may be used to etch the fifth barrier layer 51 on a top surface of the fifth dielectric layer 50, and thus the fifth barrier layer 51 may be formed into fifth barrier patterns (see 52 of FIG. 15). Therefore, as illustrated in FIG. 15, fifth redistribution patterns RDL5 may be formed each of which includes the fifth barrier pattern 52, the fifth metal pattern 54, and the metal pad 56.

According to some example embodiments, an example is explained in which the first, second, third, fourth, and fifth redistribution patterns RDL1, RDL2, RDL3, RDL4, and RDL5 are vertically stacked, but the present inventive concepts are not limited thereto, and the number of vertically stacked redistribution patterns may be two to eight.

Figure 15:
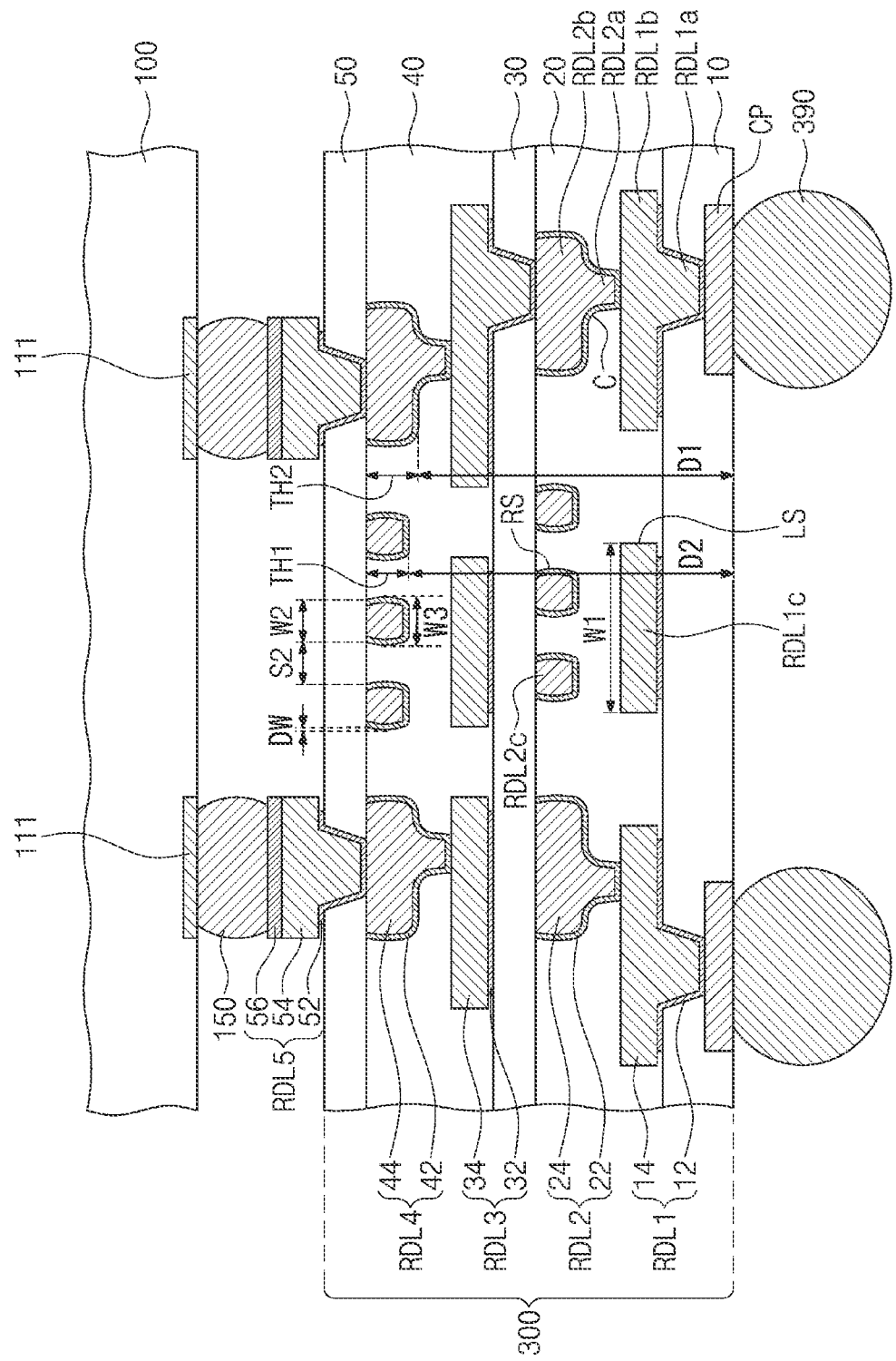
FIG. 15 illustrates a cross-sectional view partially showing a semiconductor package according to some example embodiments of the present inventive concepts.

Thereafter, as shown in FIG. 15, first connection terminals 150 may be attached to the metal pads 56 of the fifth redistribution patterns RDL5, connecting a first semiconductor chip 100 to a redistribution substrate 300.

Figure 16A:
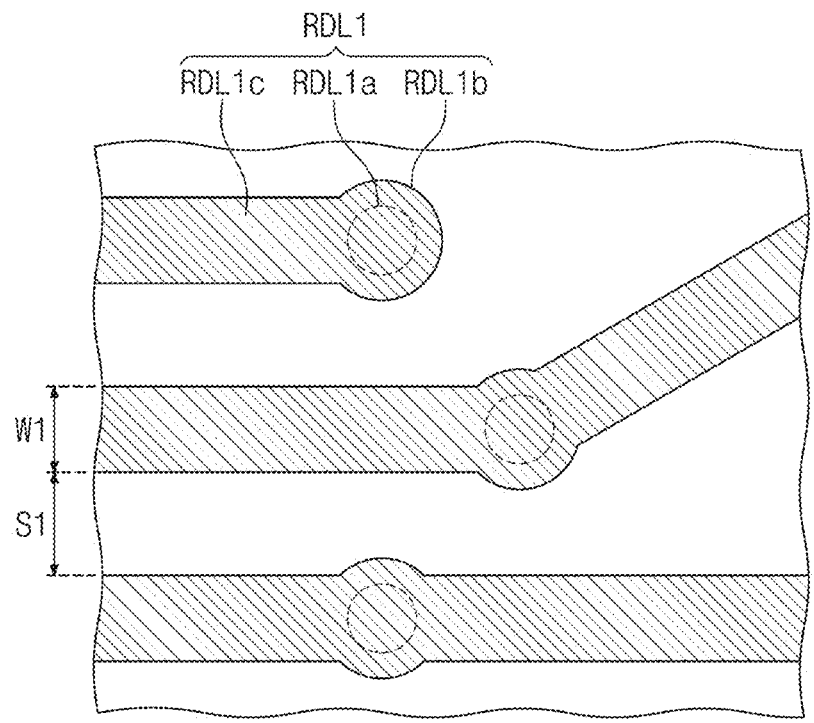
FIGS. 16A and 16B illustrate plan views showing an example of first and second redistribution layers included in a redistribution substrate according to some example embodiments of the present inventive concepts.
Figure 16B:
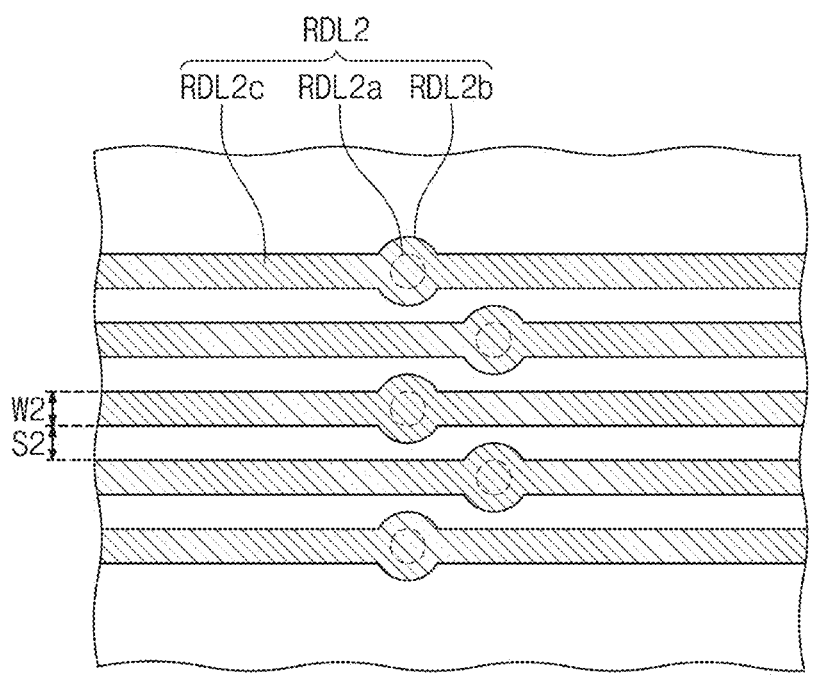

FIG. 15 illustrates a cross-sectional view showing a semiconductor package according to some example embodiments of the present inventive concepts. FIGS. 16A and 16B illustrate plan views showing an example of first and second redistribution layers included in a redistribution substrate according to some example embodiments of the present inventive concepts.

Referring to FIG. 15, a semiconductor package may include a redistribution substrate 300 and a first semiconductor chip 100 disposed on the redistribution substrate 300.

The redistribution substrate 300 may include at least one first redistribution layer and at least one second redistribution layer. For example, the redistribution substrate 300 may include first to fifth redistribution layers that are vertically stacked.

The first redistribution layer may include a first dielectric layer 10 and first redistribution patterns RDL1. The first redistribution pattern RDL1 may have a flat (e.g., linear) sidewall LS perpendicular to a top surface of the first dielectric layer 10. Each of the first redistribution patterns RDL1 may include a first barrier pattern 12 and a first metal pattern 14. The first barrier pattern 12 may have a portion disposed between the top surface of the first dielectric layer 10 and a bottom surface of the first metal pattern 14. As shown in at least FIG. 15, the first barrier pattern 12 and the first metal pattern 14 may have their sidewalls that are misaligned with each other, wherein the sidewalls are offset from each other in a horizontal direction that extends parallel to the bottom surface 300a of the redistribution substrate 300. Accordingly, as shown in at least FIG. 15, the sidewall of the first metal pattern 14 is misaligned with (e.g., offset in the horizontal direction from) a sidewall of the first barrier pattern 12.

Referring to FIGS. 15 and 16A, the first redistribution pattern RDL1 may include a first via part RDL1a that penetrates the first dielectric layer 10, a first pad part RDL1b on the first dielectric layer 10 and connected to the first via part RDL1a, and a first line part RDL1c that lies on the first dielectric layer 10 (e.g., on a top surface of the first dielectric layer) and extends in one direction from (e.g., away from) the first pad part RDL1b. The first redistribution pattern RDL1 may have a first minimum width W1 at the first line part RDL1c (e.g., the first line part RDL1c may have a first minimum width W1), and the first minimum width W1 may range from about 3.0 µm to about 10.0 µm. Neighboring first line parts RDL1c may be spaced apart from each other at a first interval S1. The first interval S1 may be the same or substantially the same as or greater than the first minimum width W1. The first redistribution pattern RDL1 may have at the first line part RDL1c a thickness ranging from about 3.0 µm to about 4.5 µm.

The second redistribution layer may include a second dielectric layer 20 and second redistribution patterns RDL2. The second dielectric layer 20 may be disposed on and thicker than the first dielectric layer 10. The second dielectric layer 20 may cover sidewalls of the first pad and line parts RDL1b and RDL1c of the first redistribution pattern RDL1. As shown in at least FIG. 15, the second dielectric layer 20 may be on the first dielectric layer 10 and may cover a sidewall (e.g., LS) of the first metal pattern 14 of the first redistribution pattern RDL1 and thus may cover a sidewall of an underlying first redistribution pattern of an underlying first redistribution layer. As shown in at least FIG. 15, the second dielectric layer 20 may have a portion interposed between (e.g., in the vertical direction) the bottom surface of the first metal pattern 14 and the top surface of the first dielectric layer 10 (e.g., based on the misaligned sidewalls of the first metal pattern and the first barrier pattern).

Each of the second redistribution patterns RDL2 may include a second barrier pattern 22 and a second metal pattern 24. The second barrier pattern 22 may be disposed between the second metal pattern 24 and the second dielectric layer 20, thereby reducing or preventing the second dielectric layer 20 from receiving a metallic material diffused from the second metal pattern 24. The second barrier pattern 22 may cover a sidewall and a bottom surface of the second metal pattern 24. The second barrier pattern 22 and the second metal pattern 24 may have their top surfaces coplanar with a top surface of the second dielectric layer 20. Accordingly, the top surface of the second dielectric layer 20 may be coplanar or substantially coplanar with a top surface of the second redistribution pattern RDL2.

Referring to FIGS. 15 and 16B, the second barrier pattern RDL2 may include a second via part RDL2a that penetrates the second dielectric layer 20 (e.g., a portion of the second dielectric layer 20), a second pad part RDL2b in (e.g., within) the second dielectric layer 20 and connected (e.g., directly connected) to the second via part RDL2a, and a second line part RDL2c that lies in (e.g., within) the second dielectric layer 20 and extends in one direction away from the second pad part RDL2b.

The second redistribution pattern RDL2 may be configured such that the second pad part RDL2b and the second line part RDL2c have their top surfaces coplanar with the top surface of the second dielectric layer 20. Restated, and as shown in FIG. 15, a top surface of the second dielectric layer 20 may be at a same level (e.g., a same distance from the bottom surface 300a in the vertical direction) as a top surface of a second distribution pattern RDL2. While the first metal pattern 14 of the first redistribution pattern RDL1 may have a flat (e.g., linear) sidewall LS, the second redistribution pattern RDL2 (e.g., the second metal pattern 24) may have a rounded (e.g., nonlinear, curving) sidewall RS at each of the second pad part RDL2b and the second line part RDL2c. The second pad part RDL2b and the second line part RDL2c may have their sidewalls RS that are laterally convex.

Accordingly, it will be understood that, in some example embodiments, the first pad part RDL1b of the first redistribution pattern RDL1 may have a linear (e.g., flat) sidewall LS, and the second pad part RDL2b of the second redistribution pattern RDL2 may have a rounded (e.g., nonlinear, curved) sidewall RS. As shown in at least FIG. 15, each of the second pad part RDL2b and the second line part RDL2c may have a rounded sidewall RS.

The second pad part RDL2b of the second redistribution pattern RDL2 may have a second thickness TH2 in the vertical direction (perpendicular to the bottom surface 300a) greater than a first thickness TH1 in the vertical direction (perpendicular to the bottom surface 300a) at the second line part RDL2c of the second redistribution pattern RDL2, such that the first thickness TH1 may be smaller in magnitude than the second thickness TH2. The first thickness TH1 may range from about 2.7 µm to about 3.5 µm, and the second thickness TH2 may range from about 3.0 µm to about 4.3 µm. A difference between the first and second thicknesses TH1 and TH2 may be about 0.3 µm to about 0.8 µm.

As shown in at least FIG. 15, a top surface of the second line part RDL2c may be at substantially the same level (e.g., at a same distance from the bottom surface 300a of the redistribution substrate 300 in the vertical direction) as a top surface of the second pad part RDL2b, and a bottom surface of the second line part RDL2c may be at a distance D2 which is at a different level than (e.g., at a different distance from the bottom surface of the redistribution substrate in the vertical direction than) a distance D1, which is the distance from the bottom surface of the redistribution substrate 300a to the bottom surface of the second pad part RDL2b.

The second redistribution pattern RDL2 may have a second minimum width W2 at the second line part RDL2c, and the second minimum width W2 may range from about 0.5 µm to about 2.0 µm. Neighboring second line parts RDL2c may be spaced apart from each other at a second interval S2. The second minimum width W2 may be the same or substantially the same as the second minimum width W2. For example, the second redistribution pattern RDL2 may have the second minimum width W2 at the top or bottom surface of the second line part RDL2c. In addition, the second redistribution pattern RDL2 may have a maximum width W3 at a level (e.g., a location at a particular distance in the vertical direction from the bottom surface) that is between the top and bottom surfaces of the second line part RDL2c. Thus, the second line part RDL2c may have a minimum width W2 at a top or bottom surface of the second line part RDL2c and a maximum width W3 at a level that is between the top and bottom surfaces of the second line part RDL2c. The aforementioned second minimum width W2 and maximum width W3 of the second redistribution pattern RDL2 may correspond to respective minimum and maximum widths of the second metal pattern 24. Accordingly, it will be understood that the second metal pattern 24 may have a minimum width at a top surface of the second metal pattern 24 or a bottom surface of the second metal pattern 24 and a maximum width at a level that is between the top surface of the second metal pattern 24 and the bottom surface of the second metal pattern 24. There may be a difference DW of about 0.3 µm to about 0.5 µm between the maximum and minimum widths at the second line part RDL2c of the second redistribution pattern RDL2.

The second via part RDL2a of the second redistribution pattern RDL2 may have a width less than that at the first via part RDL1a of the first redistribution pattern RDL1. As shown in at least FIG. 15, the second redistribution pattern RDL2 may have a rounded edge C between a sidewall of the second via part RDL2a and a bottom surface of the second pad part RDL2b. For example, the second via part RDL2a may have a width that is greater at a region adjacent to the second pad part RDL2b than at a region adjacent to the first pad pattern RDL1.

The second dielectric layer 20 may be provided thereon with third, fourth, and fifth dielectric layers 30, 40, and 50 that are sequentially stacked, and third, fourth, and fifth redistribution patterns RDL3, RDL4, and RDL5 may be respectively provided in the third, fourth, and fifth dielectric layers 30, 40, and 50. The third and fifth redistribution patterns RDL3 and RDL5 may have properties the same as those of the first redistribution patterns RDL1, and the fourth redistribution patterns RDL4 may have properties the same as those of the second redistribution patterns RDL2. For example, the third redistribution patterns RDL3 may each include a pad part and a line part that are disposed on the third dielectric layer 30, and the fifth redistribution patterns RDL5 may each include a pad part and a line part that are disposed on the fifth dielectric layer 50. The fourth redistribution patterns RDL4 may each include a pad part and a line part that are disposed on the fourth dielectric layer 40.

Accordingly, in some example embodiments, the semiconductor package shown in at least FIG. 15 may be understood to include a plurality of first redistribution layers (including at least RDL1 and RDL3, respectively) and a plurality of second redistribution layers (including at least RDL2 and RDL4, respectively) that are vertically and alternately stacked in the vertical direction that is perpendicular to the bottom surface 300a of the redistribution substrate 300. As shown in at least FIG. 15, each of the first redistribution layers may include a first dielectric layer (e.g., first dielectric layer 10 or third dielectric layer 30), and a first redistribution pattern (e.g., RDL1 or RDL3) that includes a first via part and a first pad part connected to the first via part, where the first via part of a given first redistribution layer penetrates at least a portion of the first dielectric layer of the given first redistribution layer and the first pad part of the given first redistribution layer is not a top surface of the first dielectric layer. As shown in at least FIG. 15, each of the second redistribution layers may include a second dielectric layer (e.g., second dielectric layer 20 or fourth dielectric layer 40) that is on an underlying (e.g., directly underlying) first dielectric layer (e.g., first dielectric layer 10 or third dielectric layer 30) of an underlying (e.g., directly underlying) first redistribution layer, and a second redistribution pattern (e.g., RDL2 or RDL4) that includes a second via part and a second pad part connected to the second via part, where the second via part of a given second redistribution layer penetrates a portion of the second dielectric layer of the given second redistribution layer and further is in the second dielectric layer.

As shown in FIG. 15, the first semiconductor chip 100 includes multiple chip pads 111, and the semiconductor package may include first connection terminals 150 between the redistribution substrate 300 and the chip pads 111 of the first semiconductor chip 100. The fifth redistribution patterns RDL5 may include metal pads 56, and the metal pads 56 may be connected through first connection terminals 150 to chip pads 111 of the first semiconductor chip 100. As a result, the chip pads 111 may be electrically connected to at least two of the first to fifth redistribution patterns RDL1, RDL2, RDL3, RDL4, and RDL5.

As shown in FIG. 15, the first to fifth redistribution patterns RDL1, RDL2, RDL3, RDL4, and RDL5 are each located at different distances from the bottom surface 300a of the redistribution substrate 300 in a vertical direction that extends perpendicular to the bottom surface 300a. A distance of a structure (e.g., a bottom surface, top surface, and/or center of mass thereof) from the bottom surface 300a in the vertical direction may be referred to as a "level" of the structure. Accordingly, it will be understood that some or all of the first to fifth redistribution patterns RDL1, RDL2, RDL3, RDL4, and RDL5 may be each at different levels from each other, such that, for example, some or all of the first to fifth redistribution patterns RDL1, RDL2, RDL3, RDL4, and RDL5 have respective bottom surfaces that are at different distances from the bottom surface 300a of the redistribution substrate 300 in a vertical direction that is perpendicular to the bottom surface 300a of the redistribution substrate 300.

In some example embodiments, a power voltage and/or a ground voltage may be provided to the first or third redistribution patterns RDL1 or RDL3 each of which includes the line part having the first minimum width W1 in the horizontal direction extending parallel to the bottom surface 300a of the redistribution substrate 300. Data signals and/or control signals may be provided to the second or fourth redistribution patterns RDL2 or RDL4 each of which includes the line part having the second minimum width W2 in the horizontal direction that is less (e.g., smaller in magnitude) than the first minimum width W1.

Figure 17:
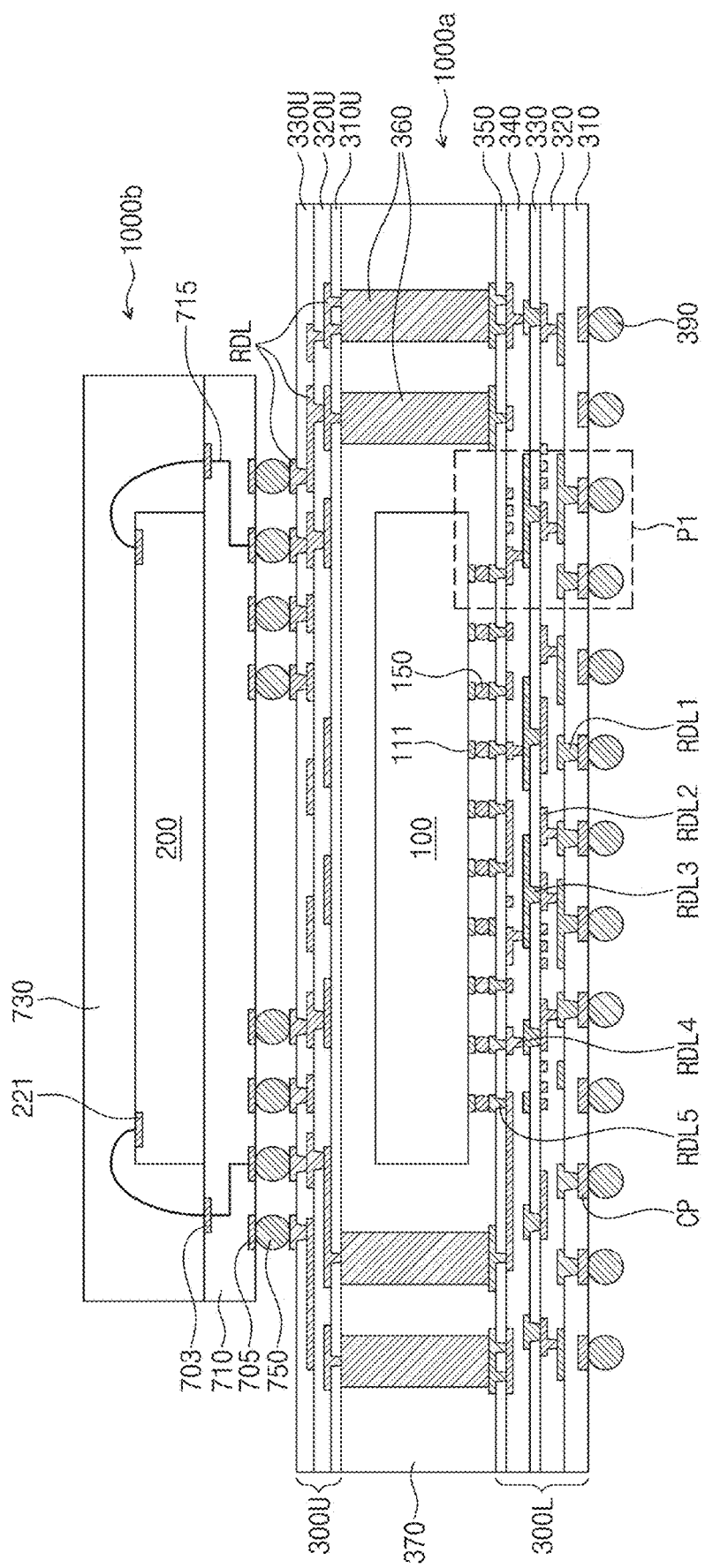
FIG. 17 illustrates a cross-sectional view showing a semiconductor package according to some example embodiments of the present inventive concepts.
Figure 18A:
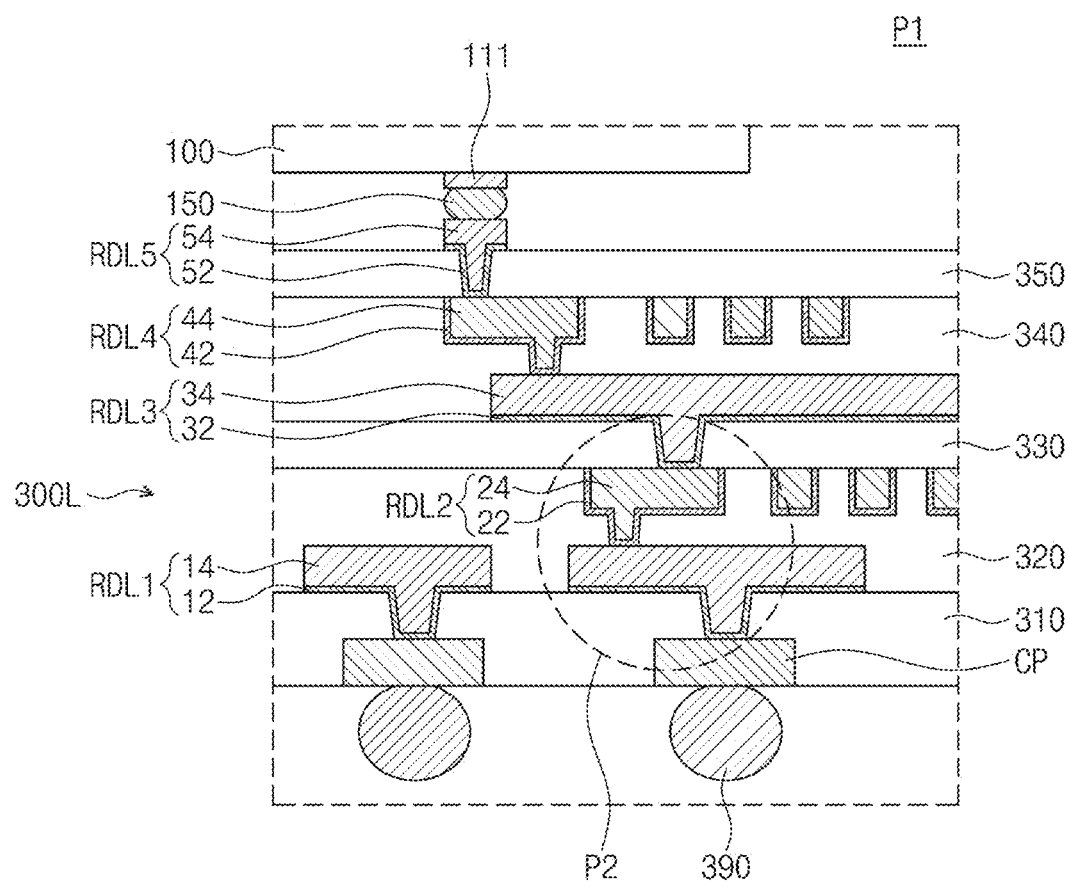
FIG. 18A illustrates an enlarged view showing section P1 of FIG. 17.
Figure 18B:
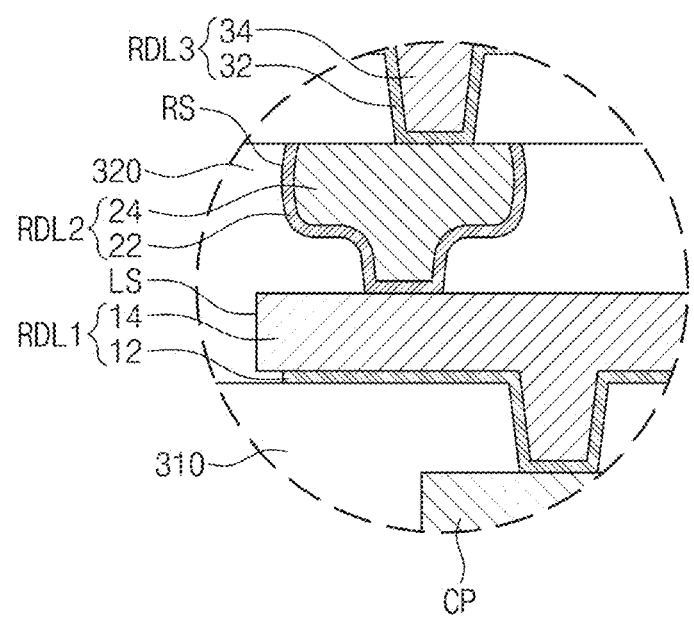
FIG. 18B illustrates an enlarged view showing section P2 of FIG. 18A.
Figure 19:
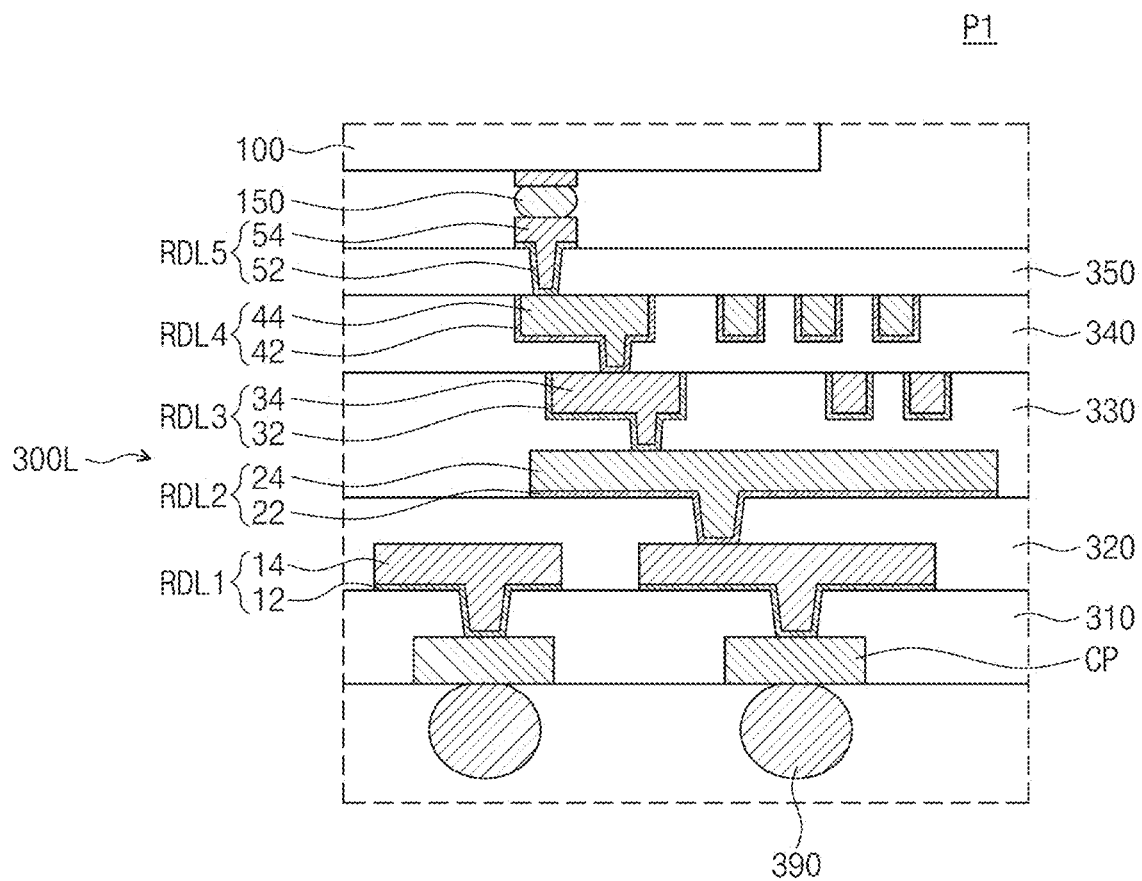
FIGS. 19, 20, and 21 illustrate enlarged cross-sectional views of section P1 depicted in FIG. 17, showing a semiconductor package according to some example embodiments of the present inventive concepts.
Figure 20:
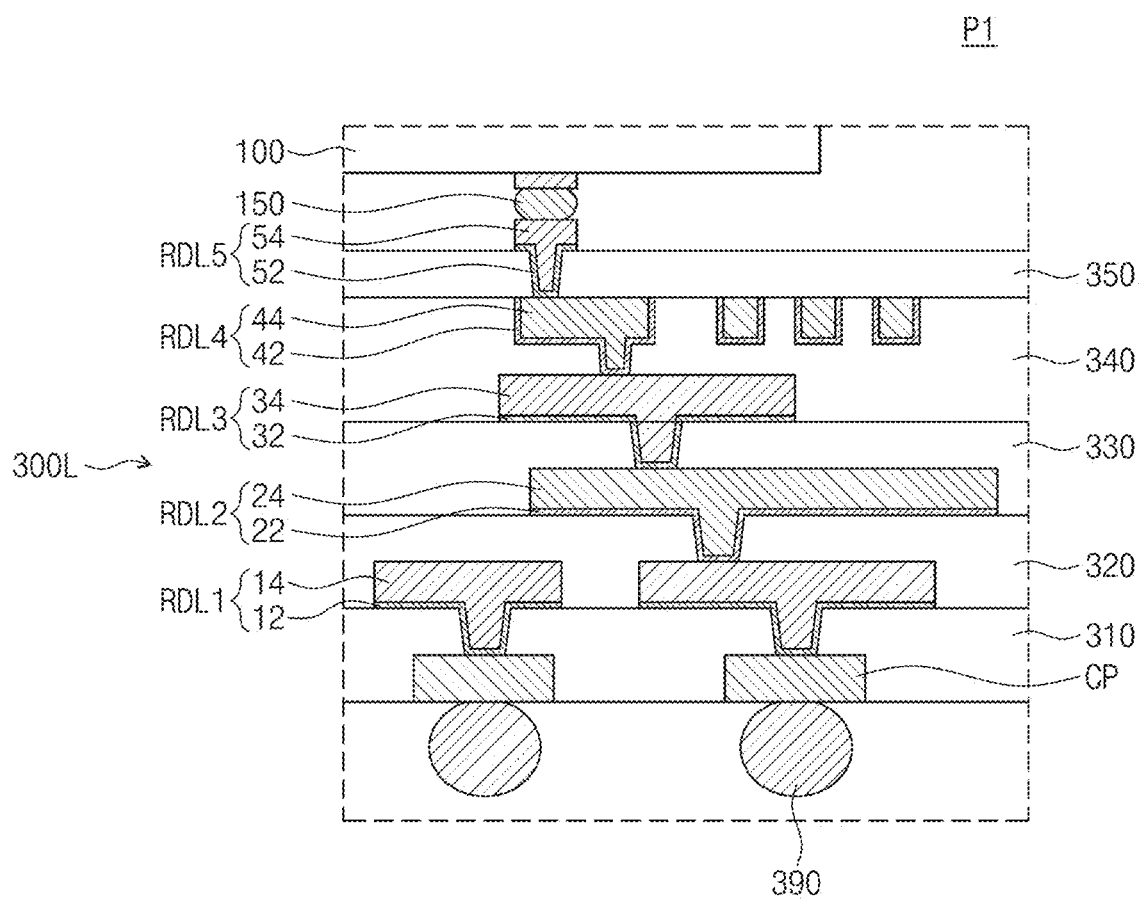
Figure 21:
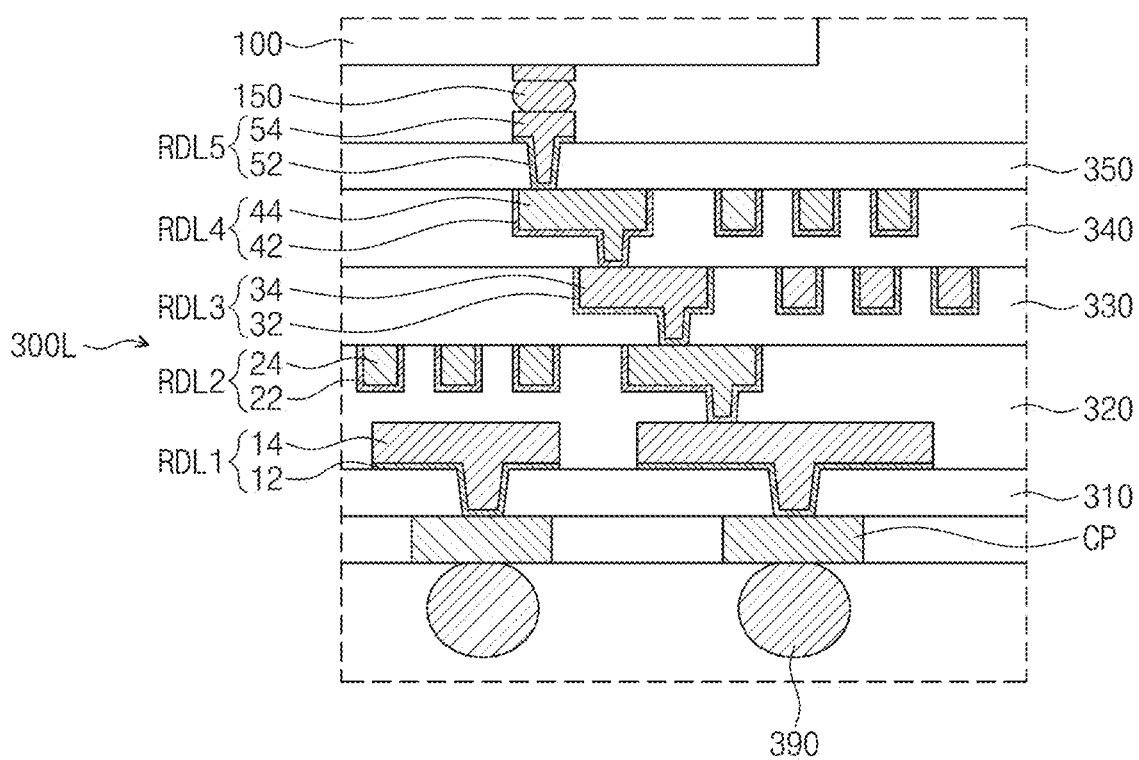

FIG. 17 illustrates a cross-sectional view showing a semiconductor package according to some example embodiments of the present inventive concepts. FIG. 18A illustrates an enlarged view showing section P1 of FIG. 17. FIG. 18B illustrates an enlarged view showing section P2 of FIG. 18A. FIGS. 19, 20, and 21 illustrate enlarged cross-sectional views of section P1 depicted in FIG. 17, showing a semiconductor package according to some example embodiments of the present inventive concepts.

The same technical features as those of the embodiments discussed with reference to FIGS. 15, 16A, and 16B may be omitted in the interest of brevity of description.

Referring to FIG. 17, a semiconductor package according to some example embodiments may include a first semiconductor package 1000a and a second semiconductor package 1000b disposed on the first semiconductor package 1000a.

The first semiconductor package 1000a may include a lower redistribution substrate 300L, an upper redistribution substrate 300U, a first semiconductor chip 100, metal pillars 360, and a molding layer 370.

As discussed above, the lower redistribution substrate 300L may include first redistribution patterns RDL1 whose pad parts and line parts are positioned on a first dielectric layer 310, and may also include second redistribution patterns RDL2 whose pad parts and line parts are positioned in a second dielectric layer 320.

For example, referring to FIGS. 18A and 18B, the lower redistribution substrate 300L may include first, second, third, fourth, and fifth dielectric layers 310, 320, 330, 340, and 350, and may also include first, second, third, fourth, and fifth redistribution patterns RDL1, RDL2, RDL3, RDL4, and RDL5 in the first, second, third, fourth, and fifth dielectric layers 310, 320, 330, 340, and 350. The first, third, and fifth redistribution patterns RDL1, RDL3, and RDL5 may include their pad parts and line parts that are disposed on the first, third, and fifth dielectric layers 310, 330, and 350, respectively. The second and fourth redistribution patterns RDL2 and RDL4 may include their pad parts and line parts that are disposed in the second and fourth dielectric layers 320 and 340, respectively.

The first, third, and fifth redistribution patterns RDL1, RDL3, and RDL5 may include their line parts each having a first minimum width (see W1 of FIG. 16A). The first minimum width may range from about 5.0 μm to about 10.0 μm.

The second and fourth redistribution patterns RDL2 and RDL4 may include their fine-pitched line parts. The second and fourth redistribution patterns RDL2 and RDL4 may include their line parts each having a second minimum width (see W2 of FIG. 16B) less than the first minimum width. The second minimum width (e.g., a width of the second line part RDL2c of the second redistribution pattern) may range from about 0.5 μm to about 2.5 μm.

The first, third, and fifth redistribution patterns RDL1, RDL3, and RDL5 may each have the same properties as those discussed above with reference to FIGS. 15 and 16A. The second and fourth redistribution patterns RDL2 and RDL4 may each have the same properties as those discussed above with reference to FIGS. 15 and 16B.

The first redistribution pattern RDL1 may include a first barrier pattern 12 and a first metal pattern 14. As shown in at least FIG. 15, the first metal pattern 14 may be on the first dielectric layer 10 and the first barrier pattern 12 may be between the first dielectric layer 10 and a bottom surface of the first metal pattern 14. The second redistribution pattern RDL2 may include a second barrier pattern 22 and a second metal pattern 24. As shown in at least FIG. 15, the second metal pattern 24 may be in (e.g., within, between top and bottom surfaces of) the second dielectric layer 20, and the second barrier pattern 22 may be between the second dielectric layer 20 and a bottom surface of the second metal pattern 24 and further between the second dielectric layer 20 and a sidewall of the second metal pattern 24. The third redistribution pattern RDL3 may include a third barrier pattern 32 and a third metal pattern 34. The fourth redistribution pattern RDL4 may include a fourth barrier pattern 42 and a fourth metal pattern 44. The fifth redistribution pattern RDL5 may include a fifth barrier pattern 52 and a fifth metal pattern 54.

The second redistribution pattern RDL2 may be configured such that the second barrier pattern 22 covers a sidewall of the second metal pattern 24, and the fourth redistribution pattern RDL4 may be configured such that the fourth barrier pattern 42 covers a sidewall of the fourth metal pattern 44. The second and fourth redistribution patterns RDL2 and RDL4 may have their rounded sidewalls RS. The first and third metal patterns 14 and 34 may have their flat and substantially linear sidewalls LS, and the sidewalls LS of the first and third metal patterns 14 and 34 may be respectively covered with the second and fourth dielectric layers 320 and 340.

According to some example embodiments, including the example embodiments shown in FIG. 19, the first and second redistribution patterns RDL1 and RDL2 may be adjacent to conductive pads CP on a bottom surface of the redistribution substrate 300 and may include their line parts having first minimum widths on the first and second dielectric layers 310 and 320, respectively.

The third and fourth redistribution patterns RDL3 and RDL4 adjacent to the first semiconductor chip 100 may be disposed in the third and fourth dielectric layers 330 and 340, respectively. The third and fourth redistribution patterns RDL3 and RDL4 may include their line parts each having a second minimum width less than the first minimum width.

According to some example embodiments, including the example embodiments shown in FIG. 20, each of the first, second, and third redistribution patterns RDL1, RDL2, and RDL3 that are sequentially stacked on the conductive pads CP may include a line part on a top surface of a corresponding one of the first, second, and third dielectric layers 310, 320, and 330. The fourth redistribution pattern RDL4 may be disposed in the fourth dielectric layer 340, and may include a line part whose line-width is less than that of the line part included in each of the first, second, and third redistribution patterns RDL1, RDL2, and RDL3.

According to some example embodiments, including the example embodiments shown in FIG. 21, the first redistribution pattern RDL1 may include a line part on the first dielectric layer 310. Each of the second, third, and fourth redistribution patterns RDL2, RDL3, and RDL4 that are sequentially stacked may be buried in a corresponding one of the second, third, and fourth dielectric layers 320, 330, and 340. Each of the second, third, and fourth redistribution patterns RDL2, RDL3, and RDL4 may include a line part whose line-width is less than that of the line part included in the first redistribution pattern RDL1.

The first metal pattern 14 of the first redistribution pattern RDL1 may have a sidewall in contact with that of the second dielectric layer 320, and each of the second, third, and fourth barrier patterns 22, 32, and 42 included in the second, third, and fourth redistribution patterns RDL2, RDL3, and RDL4 may be in contact with a corresponding one of the second, third, and fourth dielectric layers 320, 330, and 340.

Referring back to FIG. 17, the first semiconductor chip 100 may be provided on the lower redistribution substrate 300L. When viewed in plan, the first semiconductor chip 100 may be disposed on a central region of the lower redistribution substrate 300L. The first semiconductor chip 100 may have a plurality of chip pads 111 on a bottom surface thereof. The first semiconductor chip 100 may be disposed to allow its bottom surface to face a top surface of the lower redistribution substrate 300L, and the chip pads 111 of the first semiconductor chip 100 may be connected to the fifth redistribution patterns RDL5 of the lower redistribution substrate 300L. First connection terminals 150 may be attached between the chip pads 111 of the first semiconductor chip 100 and the fifth redistribution patterns RDL5 of the lower redistribution substrate 300L.

The metal pillars 360 may be disposed around the first semiconductor chip 100, may be connected to the lower redistribution substrate 300L, and may electrically connect the lower redistribution substrate 300L to the upper redistribution substrate 300U. The metal pillars 360 may penetrate the molding layer 370, and may have their top surfaces coplanar with that of the molding layer 370. The metal pillars 360 may have their bottom surfaces in direct contact with the fifth redistribution patterns RDL5 of the lower redistribution substrate 300L.

The molding layer 370 may be provided between the lower and upper redistribution substrates 300L and 300U and thus may be on the lower redistribution substrate 300L, and may cover the first semiconductor chip 100. The molding layer 370 may be provided on the top surface of the lower redistribution substrate 300L, and may cover a sidewall and a top surface of the first semiconductor chip 100. The molding layer 370 may fill gaps between the metal pillars 360, and may have a thickness the same as a length of each of the metal pillars 360. The molding layer 370 may include a dielectric polymer, such as an epoxy-based molding compound.

The second semiconductor package 1000b may be disposed on the upper redistribution substrate 300U. The upper redistribution substrate 300U may be on the molding layer 370 and may be electrically connected to the metal pillars 360. According to some example embodiments, likewise the lower redistribution substrate 300L, the upper redistribution substrate 300U may include upper redistribution patterns RDL and upper dielectric layers 310U, 320U, and 330U.

Likewise the lower redistribution substrate 300L, the upper redistribution substrate 300U may be configured such that the upper redistribution patterns RDL include a first upper redistribution pattern including a pad part and a line part that are positioned on the upper dielectric layer 310U and also includes a second redistribution pattern including a pad part and a line part that are positioned in the upper dielectric layer 320U.

The second semiconductor package 1000b may include a package substrate 710, a second semiconductor chip 200, and an upper molding layer 730. The package substrate 710 may be a printed circuit board. In some example embodiments, a redistribution substrate may be used as the package substrate 710. Lower conductive pads 705 may be disposed on a bottom surface of the package substrate 710.

The second semiconductor chip 200 may be disposed on the package substrate 710. The second semiconductor chip 200 may include integrated circuits, and the integrated circuits may include a memory circuit, a logic circuit, or a combination thereof. The second semiconductor chip 200 may include chip pads 221 electrically connected through bonding wires to upper conductive pads 703 on a top surface of the package substrate 710. The upper conductive pads 703 on the top surface of the package substrate 710 may be electrically connected to the lower conductive pads 705 through internal wiring lines 715 in the package substrate 710.

The package substrate 710 may be provided thereon with the upper molding layer 730 that covers the second semiconductor chip 200. The upper molding layer 730 may include a dielectric polymer, such as an epoxy-based polymer.

Third connection terminals 750 may be provided between the lower conductive pads 705 of the package substrate 710 and the redistribution patterns RDL of the upper redistribution substrate 300U. The third connection terminals 750 may be formed of a low-melting metal including tin (Sn), such as solder, but this is merely an example, and no limitation is imposed on the material of the third connection terminals 750. The third connection terminals 750 may each be formed as a multiple layer or a single layer. When the third connection terminal 750 is formed as a multiple layer, the third connection terminal 750 may include but not limited to solder, and when the third connection terminal 750 is formed as a single layer, the third connection terminal 750 may include but not limited to tin-silver, solder, or copper.

Figure 22:
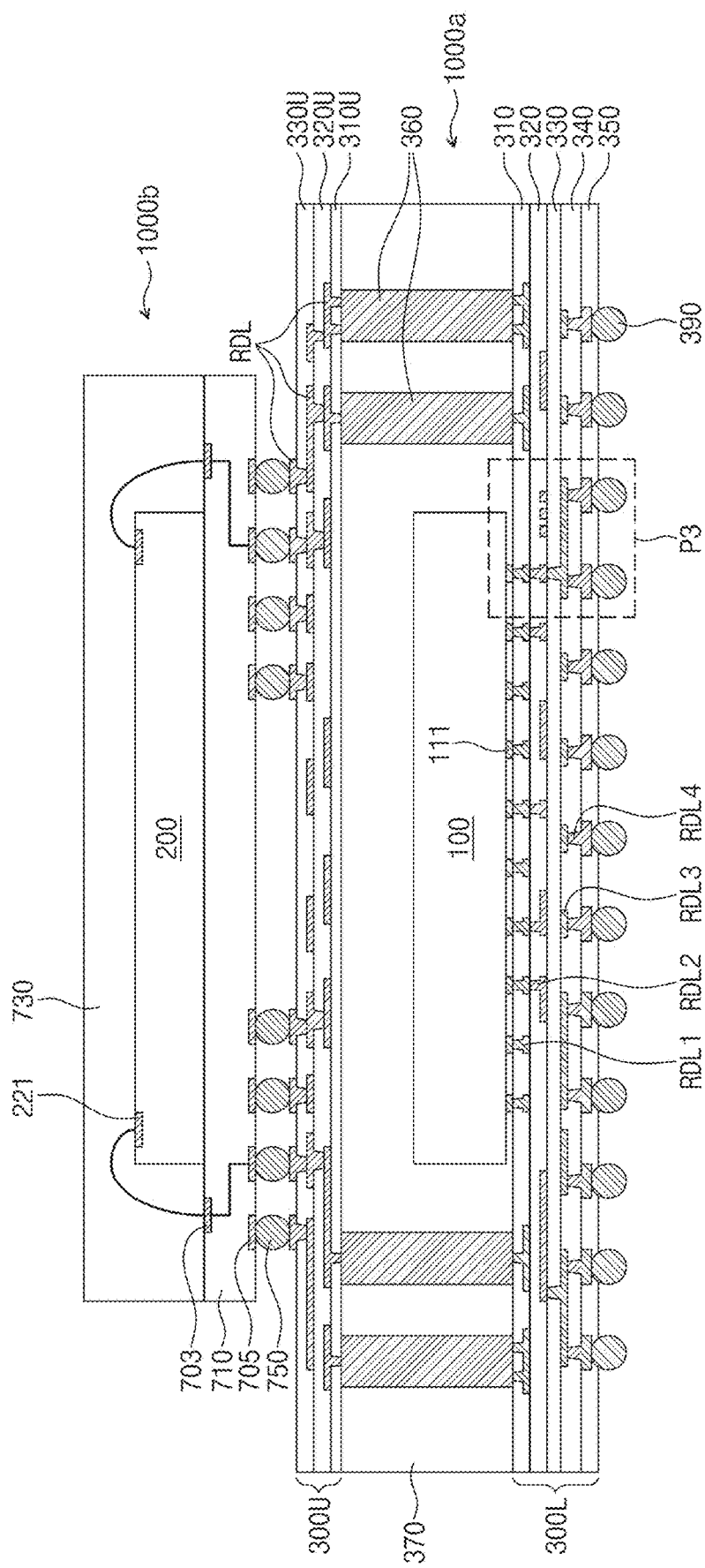
FIG. 22 illustrates a cross-sectional view showing a semiconductor package according to some example embodiments of the present inventive concepts.
Figure 23:
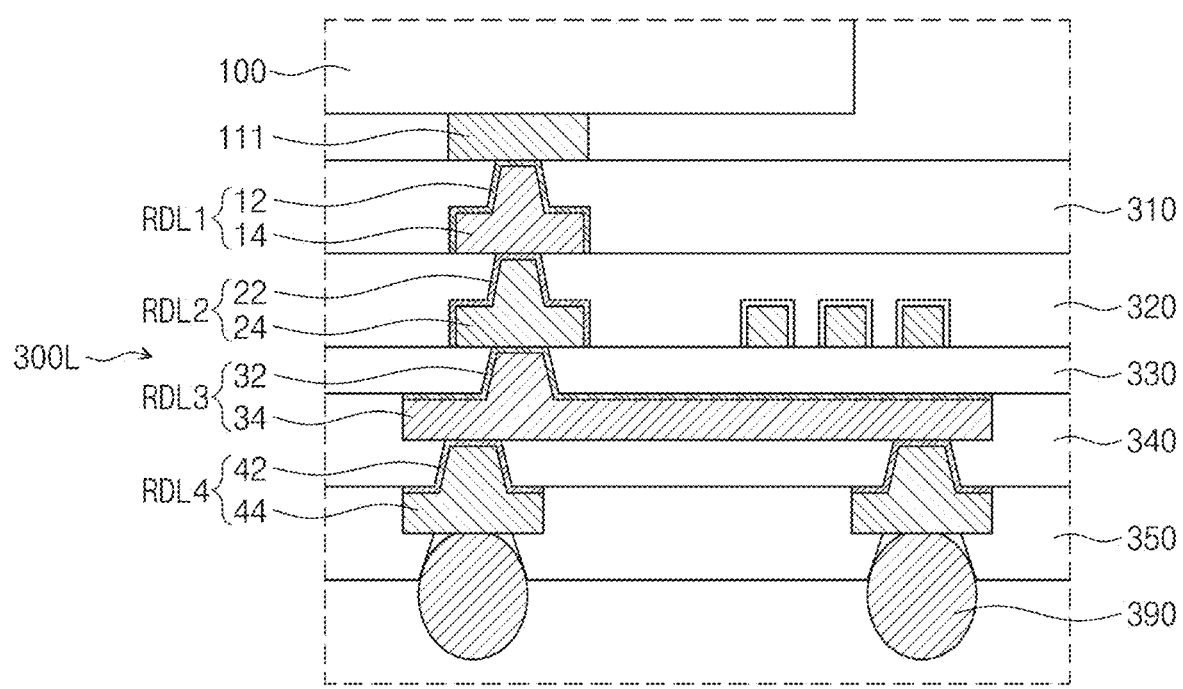
FIG. 23 illustrates an enlarged view showing section P3 of FIG. 22.

FIG. 22 illustrates a cross-sectional view showing a semiconductor package according to some example embodiments of the present inventive concepts. FIG. 23 illustrates an enlarged view showing section P3 of FIG. 22. The same technical features as those of the embodiments discussed above with reference to FIGS. 17 to 21 may be omitted in the interest of brevity of description.

Referring to FIGS. 22 and 23, differently from some example embodiments, including the example embodiments illustrated in FIG. 17, a semiconductor package according to some example embodiments may be configured such that the lower redistribution substrate 300L is formed on an active surface of the first semiconductor chip 100.

The lower redistribution substrate 300L may be configured such that the first, second, third, fourth, and fifth dielectric layers 310, 320, 330, 340, and 350 are sequentially stacked on the chip pads 111 of the first semiconductor chip 100, and that the first, second, third, and fourth redistribution patterns RDL1, RDL2, RDL3, and RDL4 are respectively disposed in the first, second, third, and fourth dielectric layers 310, 320, 330, and 340. The fifth dielectric layer 350 may be a passivation layer and provided on a bottom surface of the lower redistribution substrate 300L.

The first redistribution patterns RDL1 may include their first via parts connected the chip pads 111 of the first semiconductor chip 100. In addition, the second, third, and fourth redistribution patterns RDL2, RDL3, RDL4 may include their respective second, third, and fourth via parts that are closer to the first semiconductor chip 100 than their respective second, third, and fourth pad parts.

For example, the first and second redistribution patterns RDL1 and RDL2 may be closer to the first semiconductor chip 100 than the third and fourth redistribution patterns RDL3 and RDL4. Each of the first and second redistribution patterns RDL1 and RDL2 may include a line part whose line-width is less than that of a line part included in one of the third and fourth redistribution patterns RDL3 and RDL4. The first and second redistribution patterns RDL1 and RDL2 may include their respective first and second barrier patterns 12 and 22 that cover sidewalls of their respective first and second metal patterns 14 and 24. The third and fourth redistribution patterns RDL3 and RDL4 may include their respective third and fourth metal patterns 34 and 44 whose sidewalls are in contact with the fourth and fifth dielectric layers 340 and 350, respectively. The first and second redistribution patterns RDL1 and RDL2 each having a damascene structure may have their levels that are variously changed as discussed above.

FIGS. 24, 25, 26, and 27 illustrate cross-sectional views showing a semiconductor package according to some example embodiments of the present inventive concepts. The same technical features as those of the embodiments discussed above may be omitted in the interest of brevity of description.

Figure 24:
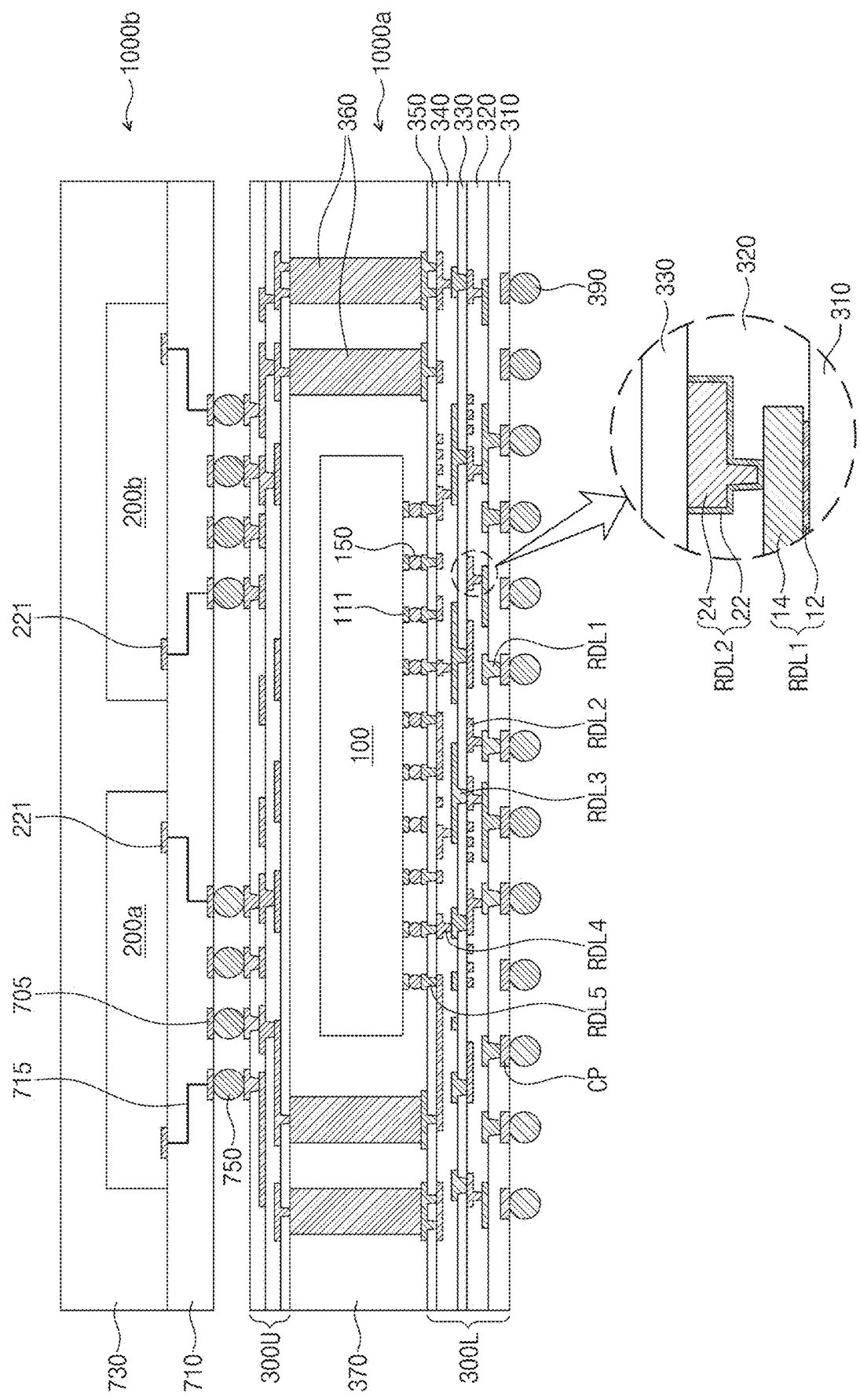
FIGS. 24, 25, 26, and 27 illustrate cross-sectional views showing a semiconductor package according to some example embodiments of the present inventive concepts.

Referring to FIG. 24, differently from some example embodiments, including the example embodiments shown in FIG. 17, a semiconductor package according to some example embodiments may be configured such that the second semiconductor package 1000b includes first and second upper semiconductor chips 200a and 200b. For example, the second semiconductor package 1000b may include the package substrate 710, the first and second upper semiconductor chips 200a and 200b on the package substrate 710, and the upper molding layer 730.

Each of the first and second upper semiconductor chips 200a and 200b may include chip pads 221 on a bottom surface thereof, and the chip pads 221 may be electrically connected to the lower conductive pads 705 through the internal wiring lines 715 in the package substrate 710. It is depicted that the first and second upper semiconductor chips 200a and 200b are provided side by side on the top surface of the package substrate 710, but instead the first and second upper semiconductor chips 200a and 200b may be sequentially stacked on the top surface of the package substrate 710.

Figure 25:
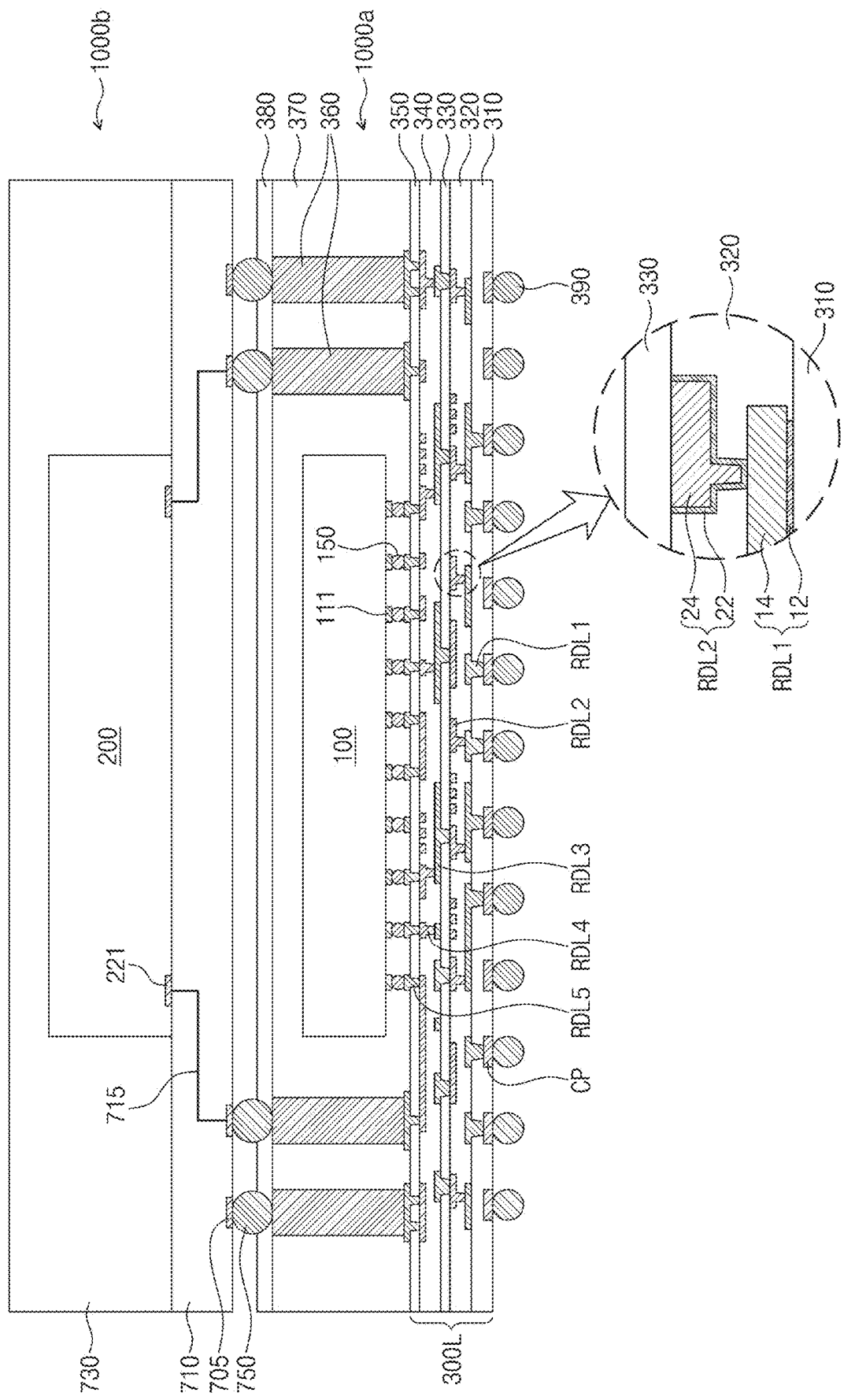

Referring to FIG. 25, differently from some example embodiments, including the example embodiments shown in FIG. 17, a semiconductor package according to some example embodiments may be configured such that an upper redistribution substrate is omitted from the first semiconductor package 1000a.

For example, an upper dielectric layer 380 may be provided on the molding layer 370, and the third connection terminals 750 may be provided between the lower conductive pads 705 of the package substrate 710 and the metal pillars 360 of the first semiconductor package 1000a.

The second semiconductor chip 200 may be disposed on the package substrate 710, and the chip pads 221 of the second semiconductor chip 200 may be adjacent to the top surface of the package substrate 710. The chip pads 221 of the second semiconductor chip 200 may be electrically connected to the lower conductive pads 705 through the internal wiring lines 715 in the package substrate 710.

Figure 26:
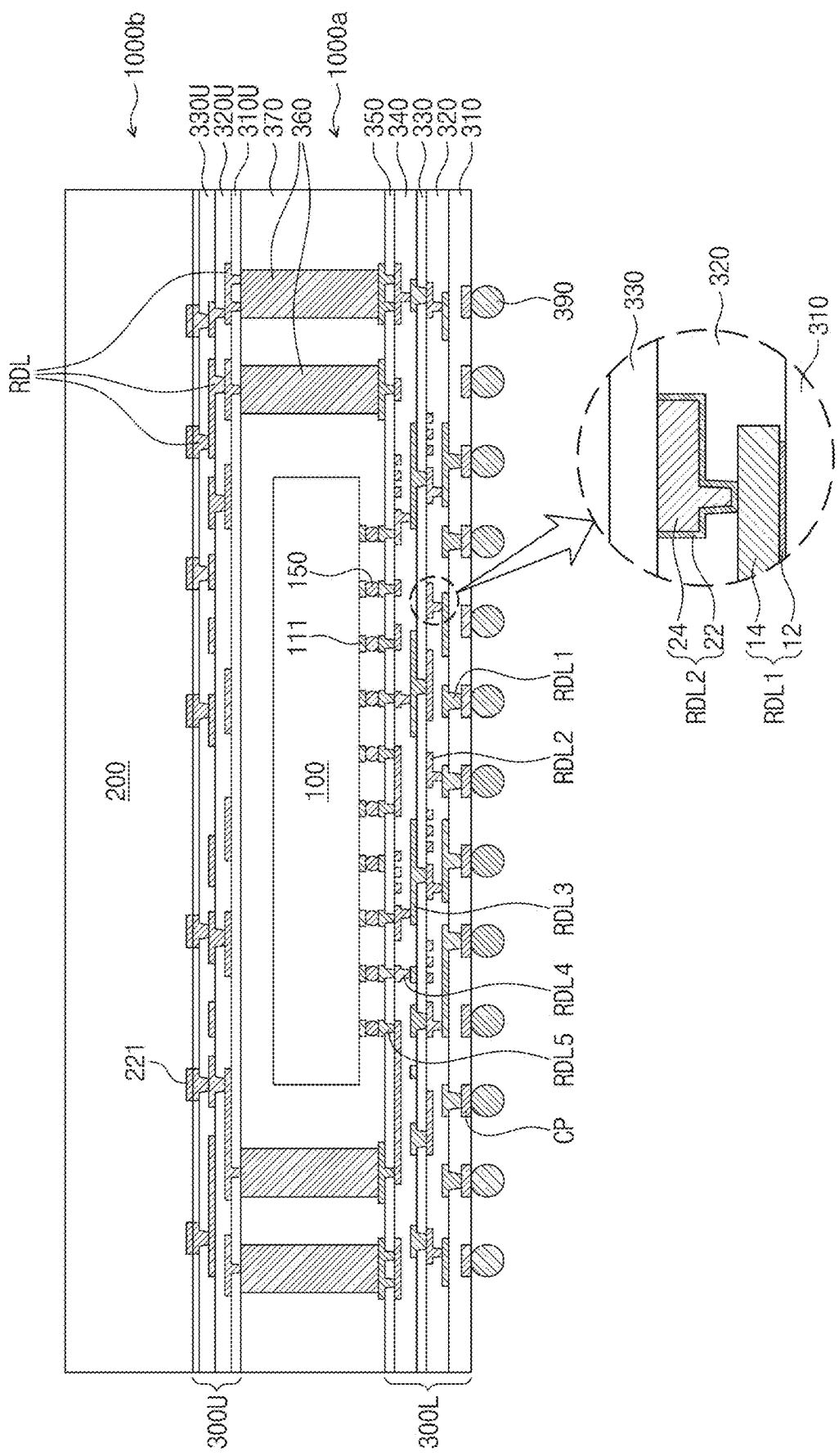

Referring to FIG. 26, a semiconductor package according to some example embodiments may include a lower redistribution substrate 300L, an upper redistribution substrate 300U, a first semiconductor chip 100, metal pillars 360, a molding layer 370, and a second semiconductor chip 200.

The lower redistribution substrate 300L, the upper redistribution substrate 300U, the first semiconductor chip 100, the metal pillars 360, and the molding layer 370 may be the same or substantially the same as those of the first semiconductor package 1000a discussed with reference to FIG. 17.

According to some example embodiments, the second semiconductor chip 200 may have a bottom surface in direct contact with the upper dielectric layer 330U of the upper redistribution substrate 300U, and the chip pads 221 of the second semiconductor chip 200 may be in direct contact with corresponding uppermost pad parts of the upper redistribution patterns RDL. The chip pads 221 of the second semiconductor chip 200 may correspond to the uppermost pad parts of the upper redistribution patterns RDL, and may have their sizes and arrangement the same as those of the uppermost pad parts of the upper redistribution patterns RDL. The chip pads 221 of the second semiconductor chip 200 may include metal, such as copper (Cu), nickel (Ni), cobalt (Co), tungsten (W), titanium (Ti), tin (Sn), or any alloy thereof.

Figure 27:
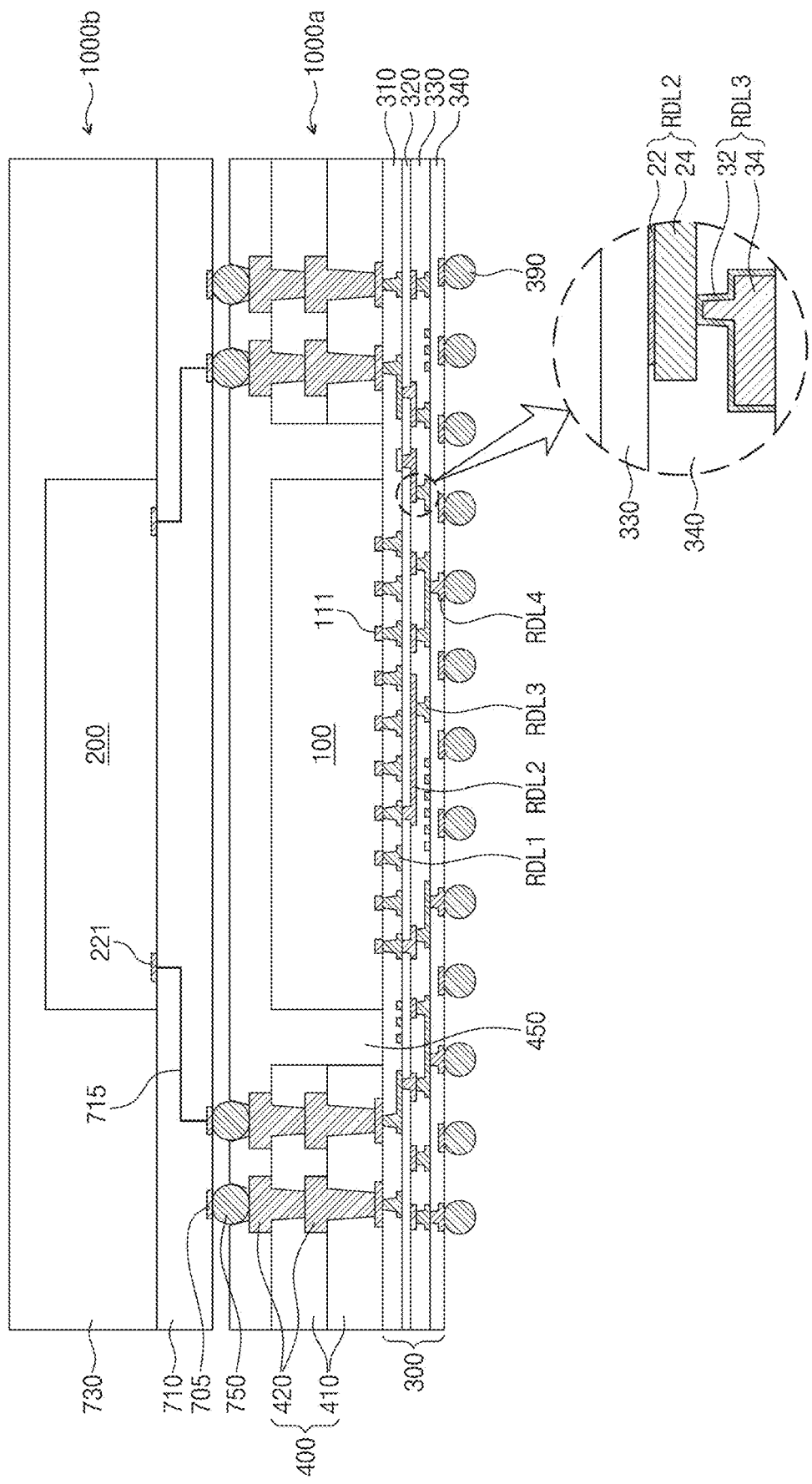

Referring to FIG. 27, a semiconductor package according to some example embodiments may include a first semiconductor package 1000a and a second semiconductor package 1000b disposed on the first semiconductor package 1000a.

The first semiconductor package 1000a may include a redistribution substrate 300, a connection substrate 400 on the redistribution substrate 300, a first semiconductor chip 100, and a molding layer 450.

As discussed above, the redistribution substrate 300 may include a plurality of dielectric layers and a plurality of redistribution patterns. For example, the redistribution substrate 300 may include first, second, third, and fourth dielectric layers 310, 320, 330, and 340 that are sequentially stacked on a bottom surface of the first semiconductor chip 100, and may also include first, second, third, and fourth redistribution patterns RDL1, RDL2, RDL3, and RDL4 in the first, second, third, and fourth dielectric layers 310, 320, 330, and 340. As discussed above, each of the first, second, third, and fourth redistribution patterns RDL1, RDL2, RDL3, and RDL4 may include a via part, a pad part, and a line part, and the via parts of the first to fourth redistribution patterns RDL1 to RDL4 may be closer to the first semiconductor chip 100 than the pad parts of the first to fourth redistribution patterns RDL1 to RDL4. In addition, one or more of the first, second, third, and fourth redistribution patterns RDL1, RDL2, RDL3, and RDL4 may include a redistribution pattern having a damascene structure. For example, the third redistribution pattern RDL3 may include a third metal pattern 34 disposed in the third dielectric layer 330 and a third barrier pattern 32 interposed between the third metal pattern 34 and the third dielectric layer 330.

The connection substrate 400 may have an opening that exposes a top surface of the redistribution substrate 300, and the first semiconductor chip 100 may be disposed in the opening of the connection substrate 400. The connection substrate 400 may be provided before or after the first semiconductor chip 100 is provided. For example, a hole may be formed in a printed circuit board, and the printed circuit board having the hole may be used as the connection substrate 400. When viewed in plan, the first semiconductor chip 100 may be disposed on a central region of the redistribution substrate 300.

The connection substrate 400 may include base layers 410 and conductive structures 420. The base layers 410 may include a dielectric material. For example, the base layers 410 may include a carbon-based material, a ceramic, or a polymer. The conductive structure 420 may include wiring patterns and a wiring via that connects the wiring patterns to each other. The conductive structures 420 of the connection substrate 400 may be connected to the first redistribution patterns RDL1 of the redistribution substrate 300. The conductive structure 420 may include metal. The conductive structure 420 may include, for example, at least one selected from copper, aluminum, gold, lead, stainless steels, silver, iron, and any alloy thereof.

The molding layer 450 may be formed on the first semiconductor chip 100 and the connection substrate 400. The molding layer 450 may extend into and fill a gap between the first semiconductor chip 100 and the connection substrate 400. The molding layer 450 may include a dielectric polymer, such as an epoxy-based polymer. The molding layer 450 may partially expose the conductive structures 420 of the connection substrate 400.

The second semiconductor package 1000b may include a package substrate 710, a second semiconductor chip 200, and an upper molding layer 730. The package substrate 710 may be a printed circuit board. In some example embodiments, the redistribution substrate 300 may be used as the package substrate 710. The package substrate 710 may have lower conductive pads 705 disposed on a bottom surface thereof.

The second semiconductor chip 200 may be disposed on the package substrate 710. The second semiconductor chip 200 may include integrated circuits, and the integrated circuits may include a memory circuit, a logic circuit, or a combination thereof. The second semiconductor chip 200 may include chip pads 221 electrically connected to the lower conductive pads 705 through internal wiring lines 715 in the package substrate 710. The package substrate 710 may be provided thereon with the upper molding layer 730 that covers the second semiconductor chip 200. The upper molding layer 730 may include a dielectric polymer, such as an epoxy-based polymer.

Third connection terminals 750 may be provided in upper holes of the molding layer 450. The third connection terminals 750 may be provided between the lower conductive pads 705 of the package substrate 710 and the conductive structures 420 of the connection substrate 400.

Figure 28:
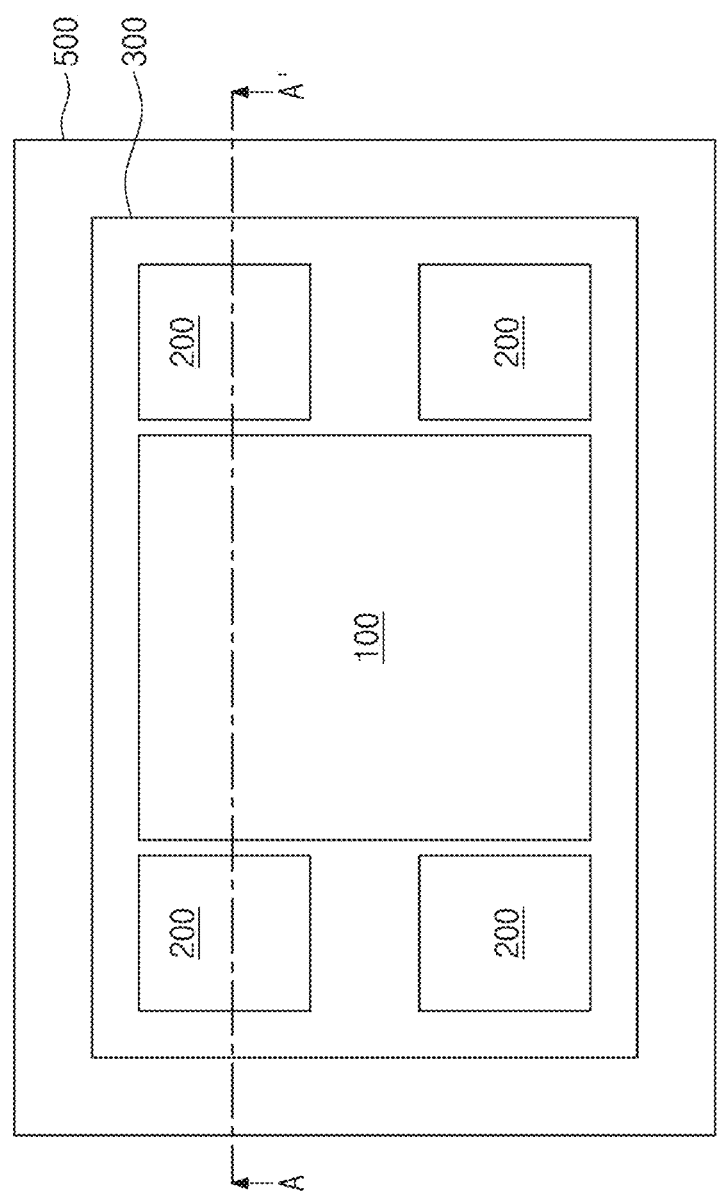
FIG. 28 illustrates a simplified plan view showing a semiconductor package according to some example embodiments of the present inventive concepts.
Figure 29:
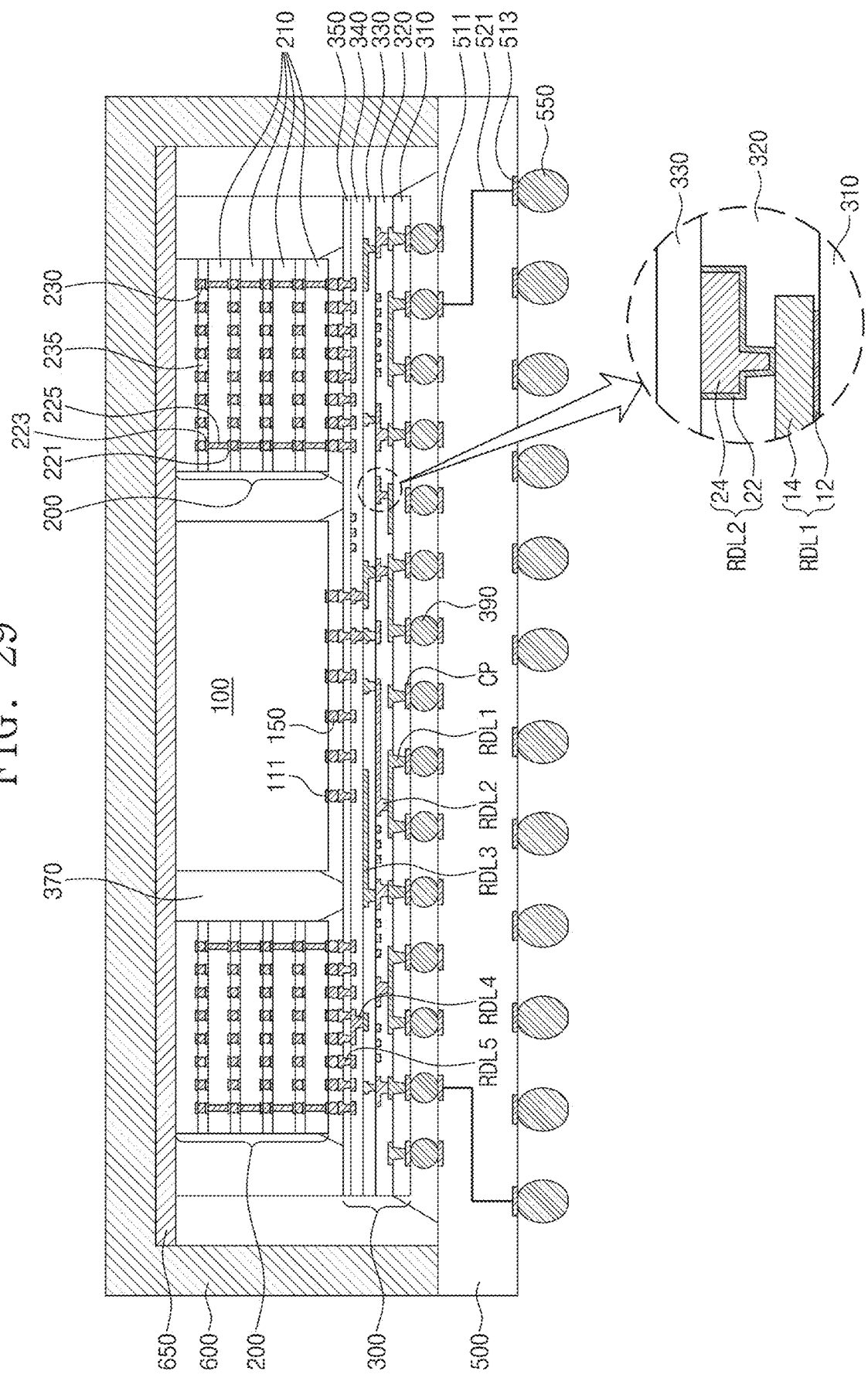
FIG. 29 illustrates a cross-sectional view taken along line A-A' of FIG. 28, showing a semiconductor package according to some example embodiments of the present inventive concepts.

FIG. 28 illustrates a simplified plan view showing a semiconductor package according to some example embodiments of the present inventive concepts. FIG. 29 illustrates a cross-sectional view taken along line A-A' of FIG. 28, showing a semiconductor package according to some example embodiments of the present inventive concepts.

Referring to FIGS. 28 and 29, a semiconductor package may include a first semiconductor chip 100, second semiconductor chips 200, a redistribution substrate 300, a package substrate 500, and a thermal radiation structure 600.

The first and second semiconductor chips 100 and 200 may be disposed on a top surface of the redistribution substrate 300.

The first semiconductor chip 100 may include chip pads 111 on a bottom surface thereof. The first semiconductor chip 100 may be a logic chip including a processor, such as a microelectromechanical system (MEMS) device, an optoelectronic device, a central processing unit (CPU), a graphic processing unit (GPU), a mobile application, or a digital signal processor (DSP). The first semiconductor chip 100 may have a thickness of about 700 μm to about 775 μm.

The redistribution substrate 300 may be provided thereon with the second semiconductor chips 200 spaced apart from the first semiconductor chip 100. Each of the second semiconductor chips 200 may include a plurality of memory chips 210 that are vertically stacked. The plurality of memory chips 210 may be electrically connected to each other through upper and lower chip pads 221 and 223, chip through vias 225, and connection bumps 230. The memory chips 210 may be stacked on the redistribution substrate 300 to achieve an alignment of their sidewalls. An adhesive layer 235 may be provided between the memory chips 210. The adhesive layer 235 may be, for example, a polymer tape including a dielectric material. The adhesive layer 235 may be interposed between the connection bumps 230, and thus an electrical short may be reduced or prevented between the connection bumps 230.

The first and second semiconductor chips 100 and 200 may be connected to the redistribution substrate 300 through first connection terminals 150. The first connection terminals 150 may be attached to the chip pads 111 and 221 of the first and second semiconductor chips 100 and 200. The first connection terminals 150 may be one or more of solder balls, conductive bumps, and conductive pillars. The first connection terminals 150 may include one or more of copper, tin, and lead. The first connection terminals 150 may each have a thickness of, for example, about 30 μm to about 70 μm.

The redistribution substrate 300 may be provided thereon with a molding layer 370 that covers the first and second semiconductor chips 100 and 200. The molding layer 370 may have a sidewall aligned with that of the redistribution substrate 300. The molding layer 370 may have a top surface coplanar with those of the first and second semiconductor chips 100 and 200. The molding layer 370 may include a dielectric polymer, such as an epoxy molding compound (EMC).

A first under-fill layer may be interposed between the first semiconductor chip 100 and the redistribution substrate 300 and between the second semiconductor chips 200 and the redistribution substrate 300. The first under-fill layer 160 may fill gaps between the first connection terminals 150. The first under-fill layer may include, for example, a thermo-curable resin or a photo-curable resin. The first under-fill layer may further include inorganic fillers or organic fillers. In some example embodiments, the first under-fill layer may be omitted, and instead the molding layer 370 may fill gaps between the redistribution substrate 300 and bottom surfaces of the first and second semiconductor chips 100 and 200.

The redistribution substrate 300 may be disposed on the package substrate 500, and may be connected through second connection terminals 390 to the package substrate 500. The redistribution substrate 300 may include a chip region and an edge region on a circumference of the chip region. The first and second semiconductor chips 100 and 200 may be disposed on the chip region of the redistribution substrate 300.

The redistribution substrate 300 may include a plurality of dielectric layers 310, 320, 330, 340, and 350, and may also include redistribution patterns RDL1, RDL2, RDL3, RDL4, and RDL5 in each of the dielectric layers 310, 320, 330, 340, and 350. As discussed above with reference to FIG. 17, at least one of the redistribution patterns RDL1, RDL2, RDL3, RDL4, and RDL5 may have a damascene structure. For example, a first redistribution pattern RDL1 may include a first metal pattern 14 whose sidewall is in contact with a second dielectric layer 320, and a second redistribution pattern RDL2 may include a second metal pattern 24 and a second barrier pattern 22 between the second metal pattern 24 and the second dielectric layer 320.

Second connection terminals 390 may be attached to conductive pads CP of the redistribution substrate 300. The second connection terminals 390 may be solder balls formed of one or more of tin, lead, and copper. The second connection terminals 390 may each have a thickness of about 40 μm to about 80 μm.

The package substrate 500 may be, for example, a printed circuit board, a flexible substrate, or a tape substrate. For example, the package substrate 500 may be one of a flexible printed circuit board, a rigid printed circuit board, and any combination thereof, each of which boards includes internal wiring lines 521 formed therein.

The package substrate 500 may have a top surface and a bottom surface that are opposite to each other, and may include upper bonding pads 511, external bonding pads 513, and internal wiring lines 521. The upper bonding pads 511 may be arranged on the top surface of the package substrate 500, and the external bonding pads 513 may be arranged on the bottom surface of the package substrate 500. The upper bonding pads 511 may be electrically connected through the internal wiring lines 521 to the external bonding pads 513. External bonding terminals 550 may be attached to the external bonding pads 513. A ball grid array (BGA) may be provided as the external bonding terminals 550.

The thermal radiation structure 600 may include a thermal conductive material. The thermal conductive material may include a metallic material (e.g., copper and/or aluminum) or a carbon-containing material (e.g., graphene, graphite, and/or carbon nano-tube). The thermal radiation structure 600 may have a relatively high thermal conductivity. For example, a single metal layer or a plurality of stacked metal layers may be used as the thermal radiation structure 600. For another example, the thermal radiation structure 600 may include a heat sink or a heat pipe. For another example, the thermal radiation structure 600 may be configured to use water cooling.

A thermal conductive layer 650 may be interposed between the thermal radiation structure 600 and the first and second semiconductor chips 100 and 200. The thermal conductive layer 650 may be in contact with a top surface of the semiconductor package and a bottom surface of the thermal radiation structure 600. The thermal conductive layer 650 may include a thermal interface material (TIM). The thermal interface material may include, for example, a polymer and thermal conductive particles. The thermal conductive particles may be dispersed in the polymer. When the semiconductor package operates, heat produced from the semiconductor package may be transferred through the thermal conductive layer 650 to the thermal radiation structure 600.

According to some example embodiments of the present inventive concepts, a redistribution substrate may include first and second redistribution patterns at different levels from each other. A planarization process may be omitted in forming the first redistribution pattern whose line-width is greater than that of the second redistribution pattern, and thus the first redistribution pattern may be reduced or prevented from having an irregular thickness caused by a dishing phenomenon. The second redistribution pattern whose line-width is less than the first redistribution pattern may be formed in a trench that is formed by an anisotropic etching process in which a hardmask pattern is used to anisotropically etch a dielectric layer, and therefore a metal pattern of the second redistribution pattern may have a sidewall covered with a barrier pattern. Hence, the second redistribution pattern may be reduced or prevented from being oxidized due to contact between the metal pattern and the dielectric layer. Accordingly, the redistribution substrate may increase in integration and reliability.

Although the present inventive concepts have been described in connection with some example embodiments of the present inventive concepts illustrated in the accompanying drawings, it will be understood to those skilled in the art that various changes and modifications may be made without departing from the technical spirit and essential feature of the present inventive concepts. It will be apparent to those skilled in the art that various substitution, modifications, and changes may be thereto without departing from the scope and spirit of the present inventive concepts.

What is claimed is:

1. A semiconductor package, comprising:
   a redistribution substrate including first and second redistribution patterns that have respective bottom surfaces that are at different distances from a bottom surface of the redistribution substrate in a vertical direction that is perpendicular to the bottom surface of the redistribution substrate; and
   a semiconductor chip on the redistribution substrate, the semiconductor chip including a plurality of chip pads electrically connected to the first and second redistribution patterns,
   wherein the first redistribution pattern includes
      a first metal pattern on a first dielectric layer, and
      a first barrier pattern between the first dielectric layer and a bottom surface of the first metal pattern,
   wherein the second redistribution pattern includes
      a second metal pattern in a second dielectric layer, and
      a second barrier pattern that is
         between the second dielectric layer and a bottom surface of the second metal pattern, and
         between the second dielectric layer and a sidewall of the second metal pattern, and
   wherein the second dielectric layer is on the first dielectric layer and directly contacts a sidewall of the first metal pattern.

2. The semiconductor package of claim 1, wherein a top surface of the second dielectric layer is at a same distance from the bottom surface of the redistribution substrate in the vertical direction as a top surface of the second redistribution pattern.

3. The semiconductor package of claim 1, wherein
   the sidewall of the first metal pattern is misaligned with a sidewall of the first barrier pattern such that the sidewall of the first metal pattern is offset from the sidewall of the first barrier pattern in a horizontal direction that is parallel to the bottom surface of the redistribution substrate, and
   a portion of the second dielectric layer is between the bottom surface of the first metal pattern and a top surface of the first dielectric layer.

4. The semiconductor package of claim 1, wherein
   the first redistribution pattern has a first minimum width in a horizontal direction that is parallel to the bottom surface of the redistribution substrate,
   the second redistribution pattern has a second minimum width in the horizontal direction, and
   the second minimum width is smaller in magnitude than the first minimum width.

5. The semiconductor package of claim 1, wherein the second redistribution pattern includes
   a via part that penetrates a portion of the second dielectric layer;
   a pad part in the second dielectric layer and connected to the via part; and
   a line part in the second dielectric layer and extending away from the pad part,
   wherein the pad part has a first thickness in the vertical direction, and
   wherein the line part has a second thickness in the vertical direction that is smaller in magnitude than the first thickness.

6. The semiconductor package of claim 5, wherein
   a top surface of the line part is at a same distance from the bottom surface of the redistribution substrate in the vertical direction as a top surface of the pad part, and
   a bottom surface of the line part is at a different distance from the bottom surface of the redistribution substrate in the vertical direction than a bottom surface of the pad part.

7. The semiconductor package of claim 5, wherein the second redistribution pattern has a rounded edge between a sidewall of the via part and a bottom surface of the pad part.

8. The semiconductor package of claim 1, wherein
   the first metal pattern has a linear sidewall, and
   the second metal pattern has a rounded sidewall.

9. The semiconductor package of claim 1, wherein the second metal pattern has
   a minimum width at a top surface of the second metal pattern or the bottom surface of the second metal pattern, and
   a maximum width at a level that is between the top surface of the second metal pattern and the bottom surface of the second metal pattern.

10. The semiconductor package of claim 1, wherein the second redistribution pattern includes
    a via part that penetrates a portion of the second dielectric layer;
    a pad part in the second dielectric layer and connected to the via part; and
    a line part in the second dielectric layer and extending away from the pad part,
    wherein the line part of the second redistribution pattern has a width of about 0.5 μm to about 2.5 μm.

11. A semiconductor package, comprising:
    a redistribution substrate that includes a plurality of first redistribution layers and a plurality of second redistribution layers that are vertically and alternately stacked in a vertical direction that is perpendicular to a bottom surface of the redistribution substrate; and
    a semiconductor chip on the redistribution substrate,
    wherein each of the first redistribution layers includes
       a first dielectric layer, and
       a first redistribution pattern that includes a first via part and a first pad part connected to the first via part, the first via part penetrating the first dielectric layer, and the first pad part being on a top surface of the first dielectric layer, wherein each of the second redistribution layers includes
a second dielectric layer on an underlying first dielectric layer of an underlying first redistribution layer, and
a second redistribution pattern that includes a second via part and a second pad part connected to the second via part, the second via part penetrating a portion of the second dielectric layer, and the second pad part is in the second dielectric layer,
wherein the first redistribution pattern includes
a first metal pattern on a first dielectric layer, and
a first barrier pattern between the first dielectric layer and a bottom surface of the first metal pattern,
wherein the second redistribution pattern includes
a second metal pattern in a second dielectric layer, and
a second barrier pattern that is
between the second dielectric layer and a bottom surface of the second metal pattern, and
between the second dielectric layer and a sidewall of the second metal pattern, and
wherein the second dielectric layer is on the first dielectric layer and directly contacts a sidewall of the first metal pattern.

12. The semiconductor package of claim 11, wherein
the second dielectric layer covers a sidewall of an underlying first redistribution pattern of the underlying first redistribution layer, and
a top surface of the second dielectric layer is coplanar with a top surface of the second redistribution pattern.

13. The semiconductor package of claim 11, wherein
the first pad part of the first redistribution pattern has a linear sidewall, and
the second pad part of the second redistribution pattern has a rounded sidewall.

14. The semiconductor package of claim 11, wherein
the second redistribution pattern further includes a line part in the second dielectric layer and extending away from the second pad part, and
the line part of the second redistribution pattern has
a minimum width at a top surface of the line part or a bottom surface of the line part, and
a maximum width at a level that is between the top surface of the line part and the bottom surface of the line part.

15. The semiconductor package of claim 14, wherein each of the second pad part and the line part has a rounded sidewall.

16. The semiconductor package of claim 11, wherein
the second redistribution pattern further includes a line part in the second dielectric layer and extending away from the second pad part,
a top surface of the line part of the second redistribution pattern is at a same distance from the bottom surface of the redistribution substrate in the vertical direction as a top surface of the second pad part of the second redistribution pattern, and a bottom surface of the line part of the second redistribution pattern is at a different distance from the bottom surface of the redistribution substrate in the vertical direction than a bottom surface of the second pad part of the second redistribution pattern.

17. The semiconductor package of claim 11, wherein the first redistribution pattern further includes a first line part on the top surface of the first dielectric layer and extending away from the first pad part,
the second redistribution pattern further includes a second line part in the second dielectric layer and extending away from the second pad part,
the first line part of the first redistribution pattern has a first minimum width,
the second line part of the second redistribution pattern has a second minimum width, and
the second minimum width is smaller in magnitude than the first minimum width.

18. A semiconductor package, comprising:
a lower redistribution substrate that includes a first redistribution pattern on a first dielectric layer and a second redistribution pattern in a second dielectric layer on the first dielectric layer;
a first semiconductor chip on the lower redistribution substrate, the first semiconductor chip including a plurality of chip pads;
a plurality of first connection terminals between the lower redistribution substrate and the plurality of chip pads of the first semiconductor chip;
a molding layer on the lower redistribution substrate, the molding layer covering the first semiconductor chip; and
a plurality of metal pillars around the first semiconductor chip and connected to the lower redistribution substrate, the metal pillars penetrating the molding layer,
wherein the second dielectric layer covers a sidewall of the first redistribution pattern,
wherein a top surface of the second dielectric layer is coplanar with a top surface of the second redistribution pattern,
wherein the first redistribution pattern includes
a first metal pattern on a first dielectric layer, and
a first barrier pattern between the first dielectric layer and a bottom surface of the first metal pattern,
wherein the second redistribution pattern includes
a second metal pattern in a second dielectric layer, and
a second barrier pattern that is
between the second dielectric layer and a bottom surface of the second metal pattern, and
between the second dielectric layer and a sidewall of the second metal pattern, and
wherein the second dielectric layer is on the first dielectric layer and directly contacts a sidewall of the first metal pattern.

* * * * *